US008269291B2

(12) United States Patent
Buchwalter et al.

(10) Patent No.: US 8,269,291 B2
(45) Date of Patent: Sep. 18, 2012

(54) LOW TEMPERATURE BI-CMOS COMPATIBLE PROCESS FOR MEMS RF RESONATORS AND FILTERS

(75) Inventors: Leena Paivikki Buchwalter, Hopewell Junction, NY (US); Kevin Kok Chan, Staten Island, NY (US); Timothy Joseph Dalton, Ridgefield, CT (US); Christopher Vincent Jahnes, Bergen County, NJ (US); Jennifer Louise Lund, Brookville, MD (US); Kevin Shawn Petraraca, Newburgh, NY (US); James Louis Speidell, Poughguag, NY (US); James Francis Ziegler, Edgewater, MD (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 13/007,130

(22) Filed: Jan. 14, 2011

(65) Prior Publication Data
US 2011/0109405 A1      May 12, 2011

Related U.S. Application Data

(62) Division of application No. 10/316,254, filed on Dec. 10, 2002, now Pat. No. 7,943,412.

(51) Int. Cl.
*G01L 9/00* (2006.01)
*H01L 29/84* (2006.01)

(52) U.S. Cl. ........ 257/419; 257/254; 257/415; 257/416; 257/417; 257/418; 257/E31.001; 257/E27.001

(58) Field of Classification Search .................. 257/254, 257/415–419, E31.001, E27.001; 438/53
See application file for complete search history.

(56) References Cited

U.S. PATENT DOCUMENTS 5,216,490 A * 6/1993 Greiff et al. ................ 73/514.35
* cited by examiner

*Primary Examiner* — Michelle Mandala
(74) *Attorney, Agent, or Firm* — F. Chau & Associates, LLC; Louis J. Percello, Esq.

(57) ABSTRACT

A microelectromechanical system (MEMS) resonator or filter including a first conductive layer, one or more electrodes patterned in the first conductive layer which serve the function of signal input, signal output, or DC biasing, or some combination of these functions, an evacuated cavity, a resonating member comprised of a lower conductive layer and an upper structural layer, a first air gap between the resonating member and one or more of the electrodes, an upper membrane covering the cavity, and a second air gap between the resonating member and the upper membrane.

31 Claims, 23 Drawing Sheets

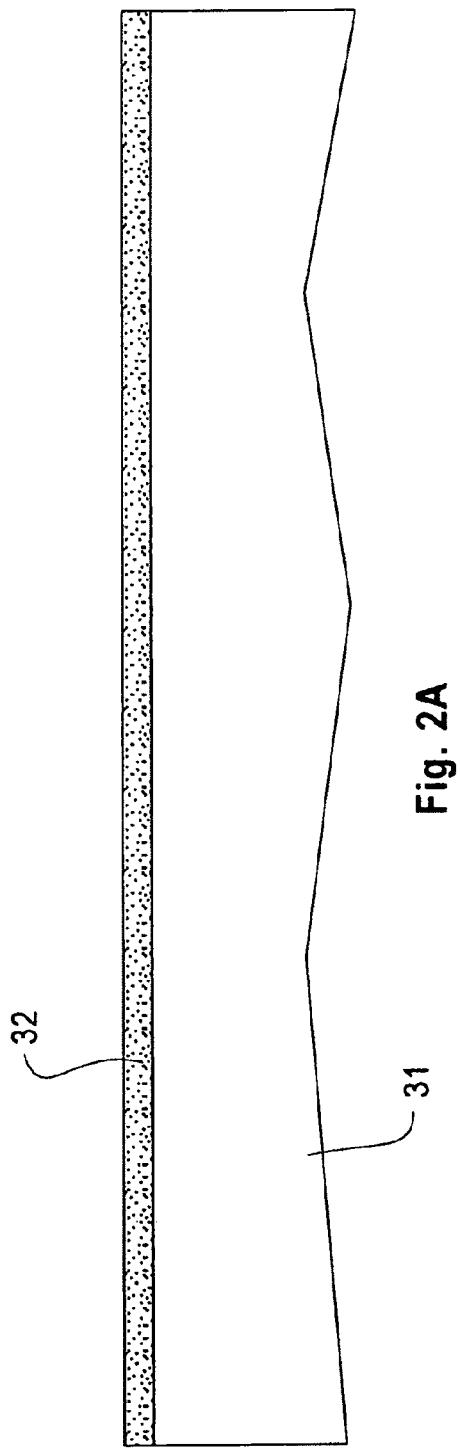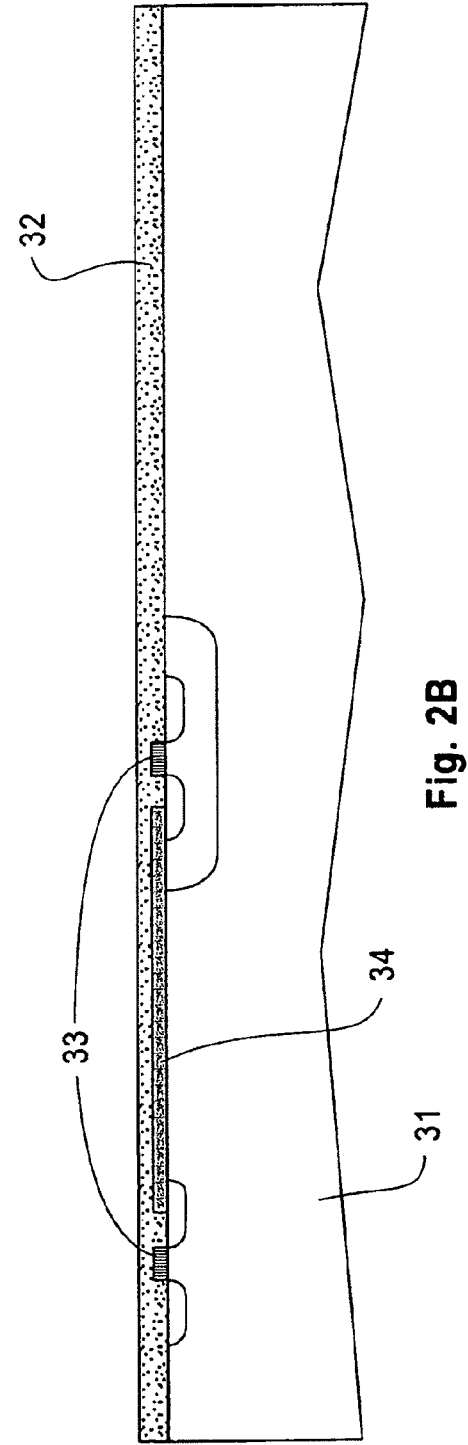

LOW TEMPERATURE BI-CMOS COMPATIBLE PROCESS FOR MEMS RF RESONATORS AND FILTERS

CROSS REFERENCE TO RELATED APPLICATIONS

This application is a Divisional Application of U.S. application Ser. No. 10/316,254, filed on Dec. 10, 2002, which claims priority to Provisional Application, Ser. No. 60/339,089, filed Dec. 10, 2001, the disclosures of which are herein incorporated by reference in its entirety.

BACKGROUND OF THE INVENTION

1. Field of the Invention

The present invention relates to microelectromechanical system (MEMS) resonators and filters, and, more particularly, to the fabrication of such devices in a manner which allows integration with other integrated circuit technologies, such as Bi-CMOS, while maintaining the desired properties of these devices such as high resonant frequency ($f_0$) and very high quality factor (Q).

2. Description of Related Art

Microelectromechanical system (MEMS) devices have the potential for great impact on the communications industry. MEMS RF switches, oscillators (resonators), filters, varactors, and inductors are a few of the devices that could replace large and relatively expensive off-chip passive components. It is even possible that the introduction of these types of MEMS devices, particularly resonators and filters, into analog and mixed-signal integrated circuits could dramatically alter the architecture of current wireless communication devices. Key to such advancements is the ability to monolithically integrate MEMS RF components with integrated circuit technologies to realize cost, size, power, and performance benefits.

MEMS resonators and filters have been under development for some time. For resonators and filters aimed at RF communications applications, the key design factors are ability to reach the frequencies of interest (approx. 900 MHz-2 GHz), low voltage operation, small size, and very high quality factor (Q). Resonators and filters developed to date have demonstrated high Qs and reasonably small sizes, but have not achieved the frequency or bias voltage targets required for incorporation with analog and mixed signal circuits. Other drawbacks of current MEMS resonators and filters include incompatibility of materials, processes, and processing temperatures for integration with other IC processes, inability to scale the devices to the desired sizes because of grain size limitations of the materials used and inability to form very small gaps between electrodes, and failure to provide protection for the MEMS devices from subsequent processing steps and ambient conditions and contamination.

Typical designs of prior art MEMS resonators and filters are illustrated in FIGS. 1A-1C. FIG. 1A shows a comb-drive type MEMS filter. Stationary combs 1 and 7 are connected via anchors 2 and 8 to input and output electrodes 3 and 9, respectively. Moving comb 4 is connected via anchors 5 to ground plane 6. The fingers of all three comb structures are suspended above the underlying substrate, the ground plane, and the input and output electrodes except at the anchor points. All three combs are comprised of a conductive material, typically heavily doped polysilicon. The ground plane and input and output electrodes are also conductors typically made from heavily doped polysilicon. During operation, ground plane 6 is electrically contacted to the ground potential. The potential of moving comb 4 is also at ground. An AC excitation, superimposed on a DC bias, is applied to input electrode 3 and thus, via anchor 2, to stationary comb 1. The same DC bias is applied to output electrode 9 and thus, via anchor 8, to stationary comb 7. Because of the potential difference between the fingers of stationary comb 1 and moving comb 4, moving comb 4 is attracted laterally toward stationary comb 1. The magnitude of this potential difference, and thus the distance which moving comb 4 travels, is modulated by the AC excitation. When the frequency of the exciting AC voltage closely matches the mechanical resonant frequency $f_0$ of moving comb 4, the amplitude of vibration of moving comb 4 reaches a maximum that is dependent on the quality factor Q of the system. Simultaneously, the fingers of moving comb 4 and stationary comb 7 comprise a time-varying capacitor as the amount of overlap between the fingers of the combs changes with the movement of moving comb 4. Thus, through the relationship $I=d(CV)/dt$, there will also be a time-varying current which can be sensed electrically at output electrode 9. The magnitude of this current will also be greatest when the frequency of the exciting AC voltage at input electrode 3 closely matches the $f_0$. Thus, the device provides electromechanical filtering of the input signal around $f_0$.

FIG. 1B shows another example of a prior art MEMS filter which is aimed at achieving higher-frequency operation. Two beams 11 and 15 are connected to ground electrodes 13 via anchors 12. Beams 11 and 15 are also connected to one another by bridge 14. Taken alone, either beam 1 for beam 15 comprises a MEMS resonator. Coupling two or more MEMS resonators together creates the MEMS filter. Beams 11, 15, and bridge 14 are suspended above the underlying substrate. Ground electrodes 13, and input and output electrodes 16 and 17 (respectively) are also suspended above the underlying substrate except at anchor points 12. Beams 11 and 15, bridge 14, and all electrodes 13, 16 and 17 are composed of a conductive material, typically heavily doped polysilicon. During operation, ground electrodes 13 are electrically contacted to the ground potential; thus, via anchors 12, the potential of beams 11 and 15 and bridge 14 are also at ground. An AC excitation, superimposed on a DC bias, is applied to input electrode 16. The same DC bias is applied to output electrode 17. Because of the potential difference between them, beam 11 is attracted downward toward electrode 16. The magnitude of this potential difference, and thus the distance which beam 11 travels, is modulated by the AC excitation. When the frequency of the exciting AC voltage closely matches the mechanical resonant frequency $f_0$ of beam 11, the amplitude of vibration of beam 11 reaches a maximum that is dependent on the quality factor Q of the system. The mechanical energy of vibration of beam 11 is transmitted via bridge 14 to beam 15. Beam 15 and output electrode 17 comprise a time-varying capacitor as the distance between the two structures changes with the movement of beam 15. Thus, through the relationship $I=d(CV)/dt$, there will also be a time-varying current which can be sensed electrically at output electrode 17. The magnitude of this current will also be greatest when the frequency of the exciting AC voltage at input electrode 16 closely matches the $f_0$. Thus, the device provides electromechanical filtering of the input signal around $f_0$.

FIG. 1C shows cross section A-A' of prior art MEMS resonator 11 as seen in FIG. 1B. This cross section also shows the substrate 21 upon which the MEMS resonator or filter is constructed. This substrate is typically silicon (Si), although other substrates such as glass, quartz, or gallium arsenide (GaAs) have also been used. Also shown is insulating layer 22, typically silicon dioxide ($SiO_2$), used to electrically isolate the MEMS device from the substrate and other devices.

Air gap 23 can be seen in the cross section, demonstrating that beam 11 is freestanding except at anchor points 12. Not shown here is the sacrificial material that occupied gap 23 during the construction of this device, and was later removed so that beam 11 would be free to vibrate.

One of the drawbacks of the prior art is the deposition temperature of the materials commonly used for construction of the MEMS device. Although various conductive materials have been used to form MEMS resonators and filters, polysilicon is the most common. Polysilicon is frequently chosen because of its relatively high ratio of elastic modulus (E) to density ($\rho$). This ratio is one of the most important factors in determining the resonant frequency of the device, and since high frequencies are sought for RF communications applications, high ratios of E/$\rho$ are desirable. However, polysilicon must be deposited at temperatures in excess of 600° C. Furthermore, the dopant atoms, such as phosphorus, which are added to the polysilicon to make it sufficiently conductive, frequently must be annealed at temperatures near 900° C. in order to activate them. These temperatures are well above the temperatures used in fabrication of the metal interconnect levels of integrated circuit processes. This means that prior art MEMS resonators and filters, if they were to be integrated in an IC process, would have to be fabricated at the same time as the transistor devices (which permit higher processing temperatures). This type of process integration is much more difficult to achieve and is very specific to the particular IC process. Thus, the process steps for formation of the MEMS device would likely need to be altered each time there was a change to the IC process, or whenever it was desired to integrate the MEMS device with a different IC process. A much simpler and more modular approach is to integrate the MEMS device after all circuit processing, including interconnect levels, has been completed. However, this cannot be done with prior art MEMS resonators and filters.

Another serious issue with prior art MEMS resonators and filters is the process by which the devices are released from the surrounding layers and substrate. The most commonly used sacrificial material (i.e., the material which temporarily occupies the gap region and is later removed to create the freestanding MEMS structure) in the prior art is $SiO_2$. This material is removed by means of etching in an aqueous buffered hydrofluoric acid (buffer-HF) solution. This solution will also remove silicon nitride (SiN), although at a slower rate, and causes etching of or damage too many metals. Because $SiO_2$ and SiN are used as insulating layers in integrated circuits, this release method also makes it very difficult to integrate prior art MEMS resonators and filters with IC processes. Another problem with the use of aqueous buffer-HF as a release method is the occurrence of a phenomenon known as stiction. After the sacrificial $SiO_2$ has been removed, the buffer-HF is rinsed away. As the water is then removed during the subsequent drying step, the freestanding MEMS parts have a tendency to stick to the substrate or surrounding materials because of the high surface tension of the water. Prior art MEMS devices frequently have to be subjected to an alternative drying method such as the use of supercritical carbon dioxide ($CO_2$). This method and the associated tools are also not part of any current IC process flow. Another drawback to using aqueous buffer-HF to remove the sacrificial layer is that it restricts the aspect ratios and gap dimensions that can be achieved in MEMS devices. Very small gaps (tens-few hundred nanometers) cannot be formed because of limited transport of the etchant and etch products in and out of the gap region. Small gaps are desirable in MEMS devices because they allow the use of lower actuation voltages. Typical RF ICs use supply voltages of 3V; most prior art MEMS resonators and filters require biases of 20V and up.

Another concern with prior art MEMS resonators and filters is the lack of adequate encapsulation of the devices for protection during subsequent processing steps, and from ambient contamination, humidity, and pressure when fabrication is complete. Once the MEMS device has been released, additional processing steps create the risk of re-filling the gap area with deposited material and re-connecting the device to the substrate, causing failures due to stiction, or adversely affecting yield or performance via the introduction of particulates to the gap region or the device itself. Even after all fabrication is complete, MEMS resonators and filters are quite sensitive to ambient conditions. For example, a particulate adhering to the resonator beam could change the mass (and thus the resonant frequency) of a small beam by several hundred percent. A particulate lodged in the gap region would damp or completely prevent resonance. Finally, it has been established that the quality factor of MEMS resonators and filters is directly related to ambient pressure, and in order to maximize Q, MEMS resonators and filters must be operated at pressures below about 0.1 Torr. Several encapsulation schemes have been proposed in the prior art. The most common methods involve bonding a second substrate with an etched cavity over the MEMS device by various means (e.g. anodic bonding, eutectic bonding, etc.). However, to date these methods have not been adequately demonstrated at wafer scale. Each individual device must be capped. This method is not compatible with reasonable manufacturing processes. This method also causes difficulties with integrated circuit designs intended for packaging via flip-chip (solder bump) die attach. Furthermore, this method assumes that the MEMS resonator or filter is the last device fabricated (i.e., it is exposed on the top surface of the chip), and it has already been seen that prior-art MEMS resonators and filters are not compatible with fabrication after the completion of IC processing. Another encapsulation method that has been proposed in the prior art is to cover the MEMS resonator with additional $SiO_2$, then to cap the entire structure with a shell of porous polysilicon. The device is then exposed again to aqueous buffer-HF, which is transported through the porous polysilicon, removes the covering $SiO_2$, and diffuses back out through the porous polysilicon. This method is unsatisfactory for many reasons, several of which (deposition temperature of polysilicon and stiction) have already been discussed.

BRIEF SUMMARY

Accordingly, it is an object of the present application to provide a MEMS resonator or MEMS filter having electrodes energized by an applied DC potential and excited by an applied AC potential, causing a moveable structure to vibrate at its mechanical resonant frequency, thereby providing a frequency reference or filtering a signal of interest around the resonant frequency.

It is another object to provide a method for the construction of these devices which allows them to be fabricated at temperatures low enough to be compatible with the metal interconnect levels of any analog, digital, or mixed signal integrated circuit process.

It is yet another object to provide a method for releasing the freestanding portions of these devices from the surrounding substrate and materials in a manner which is also compatible with the metal interconnect levels of any analog, digital, or mixed signal integrated circuit process, which eliminates stiction during processing, and which allows for the construction of ultra-small gaps between electrodes in these devices.

It is a further object of the invention to provide a method of encapsulation of these devices which protects them from subsequent processing steps, contamination, and ambient conditions such as humidity, pressure, and the like.

The present invention describes a process for the fabrication of MEMS resonators or filters at temperatures low enough to permit integration with analog, digital, or mixed-signal IC processes after or concurrently with the formation of metal interconnects in those processes.

According to the present invention, the performance requirements of MEMS resonators and filters, in particular high frequency operation and high Q, can be achieved through the selection of materials that are compatible both with IC processes and with these specifications.

The invention also includes methods for the clean removal of sacrificial material without yield loss due to stiction, without need for non-standard processing techniques, and permitting the construction of very small gaps that allow operation of the MEMS resonators and filters using actuation voltages compatible with analog IC supply voltages.

It is a principal object of the present invention to provide a method of vacuum encapsulation of these devices that will protect them from subsequent processing steps (such as dicing, die attach, bonding, packaging, and the like) and ambient contamination and humidity which may cause device failure, and that will provide low enough pressure for maximum device performance (high Q). This method of encapsulation is wafer-scale; that is, all MEMS devices on a wafer are protected simultaneously during processing.

Further and still other objects of the present invention will become more readily apparent from the following detailed description taken in conjunction with the accompanying figures.

BRIEF DESCRIPTION OF THE SEVERAL VIEWS OF THE DRAWINGS

FIGS. 2A-2B show cross-sectional views of sample substrates upon which the device could be fabricated.

DETAILED DESCRIPTION

Figure 1A:
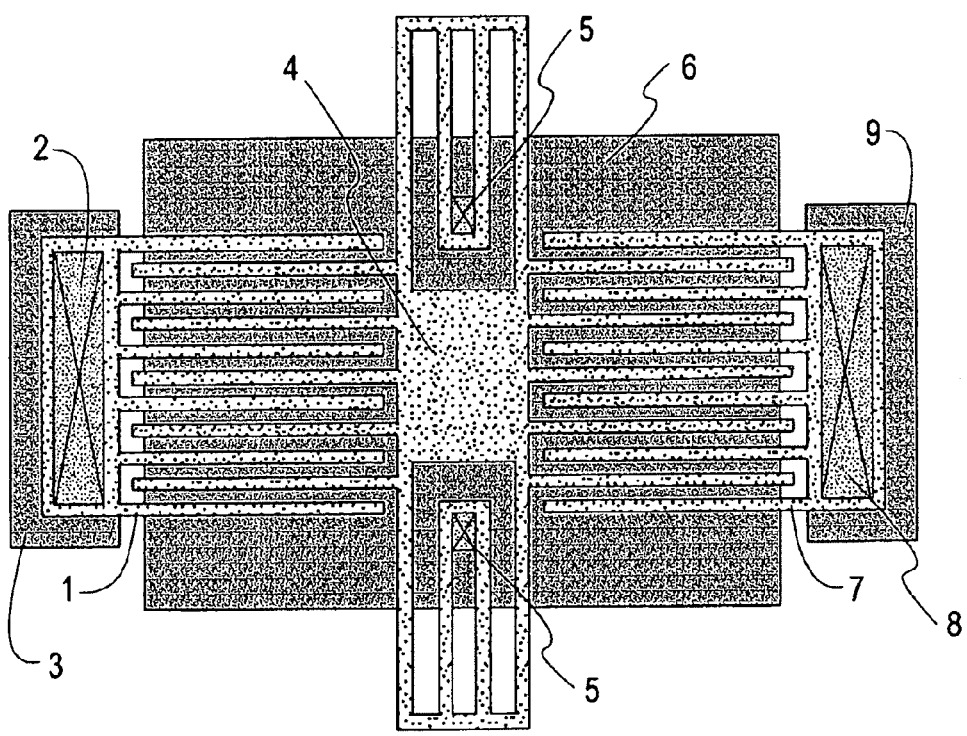
FIGS. 1A-1C describe the prior art.
Figure 1B:
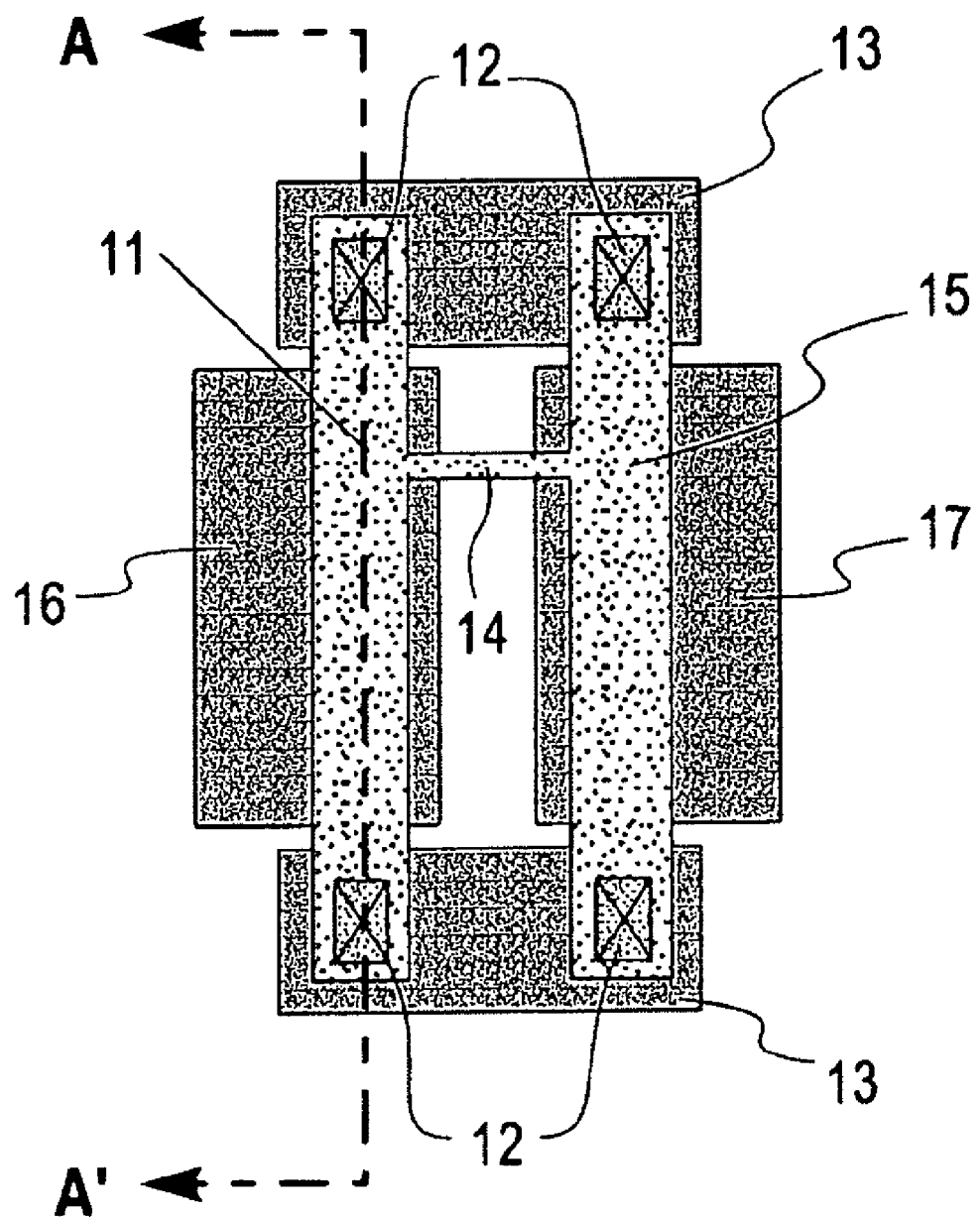
Figure 1C:
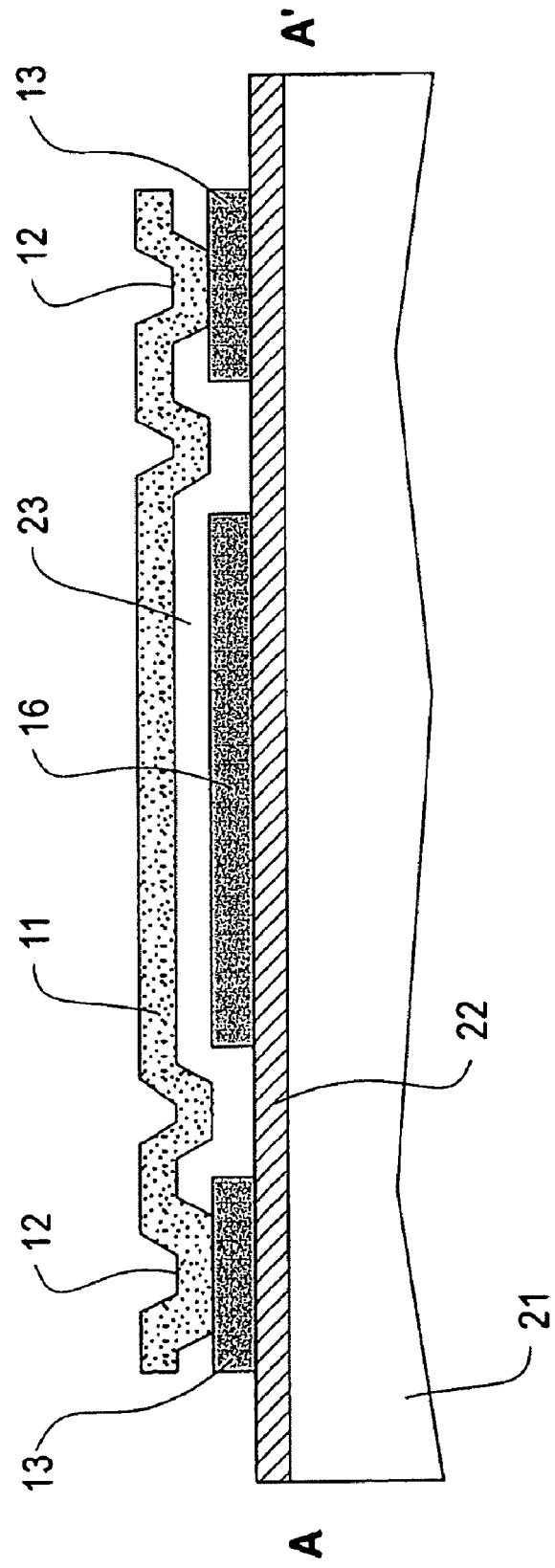

FIGS. 3-11B show cross-sectional views according to a preferred embodiment of the invention for a device such as the one shown in the prior art in FIG. 1B and in cross-section in FIG. 1C. However, MEMS resonators and filters can be designed in a wide variety of configurations including comb-drive resonators, beams fixed at two ends, beams fixed at one end, beams with suspensions, coupled beams, tuning forks, beams with bends or turns, curved beams, disks, and so on. These drawings of FIGS. 3-11B are in no way intended to exclude other geometries and configurations for building a MEMS resonator or filter, and all such geometries and configurations are included herein. The process of manufacture described is the same for all such configurations, and the design shown in FIGS. 3-11B is chosen for convenience of description only.

FIG. 2A shows a typical starting substrate 31 covered by an insulating layer 32. Starting substrates 31 may include a variety of materials such as silicon with or without epitaxial layers, high resistivity silicon (HRS), silicon-on-insulator (SOI), glass, quartz, sapphire, GaAs, or other substrates commonly used in integrated circuit manufacturing. The insulating layer 32 could be $SiO_2$, SiN, silicon oxy-nitrite (SiON), or any of a variety of organic insulators, or some combination of layers of insulating materials. If the starting substrate 31 is itself an insulator such as quartz, the insulating layer 32 may be omitted. FIG. 2B shows a semi-conducting substrate 31 such as silicon, SOI, or the like in which active devices 33 such as transistors, diodes, varactors, etc. have already been fabricated, along with any desired local interconnect layers 34. An insulating layer 32 has covered the substrate and active devices. The drawings that follow assume that a substrate such as the one in FIG. 2B has been used, since this type of substrate offers maximum utility for the MEMS device.

Figure 3:
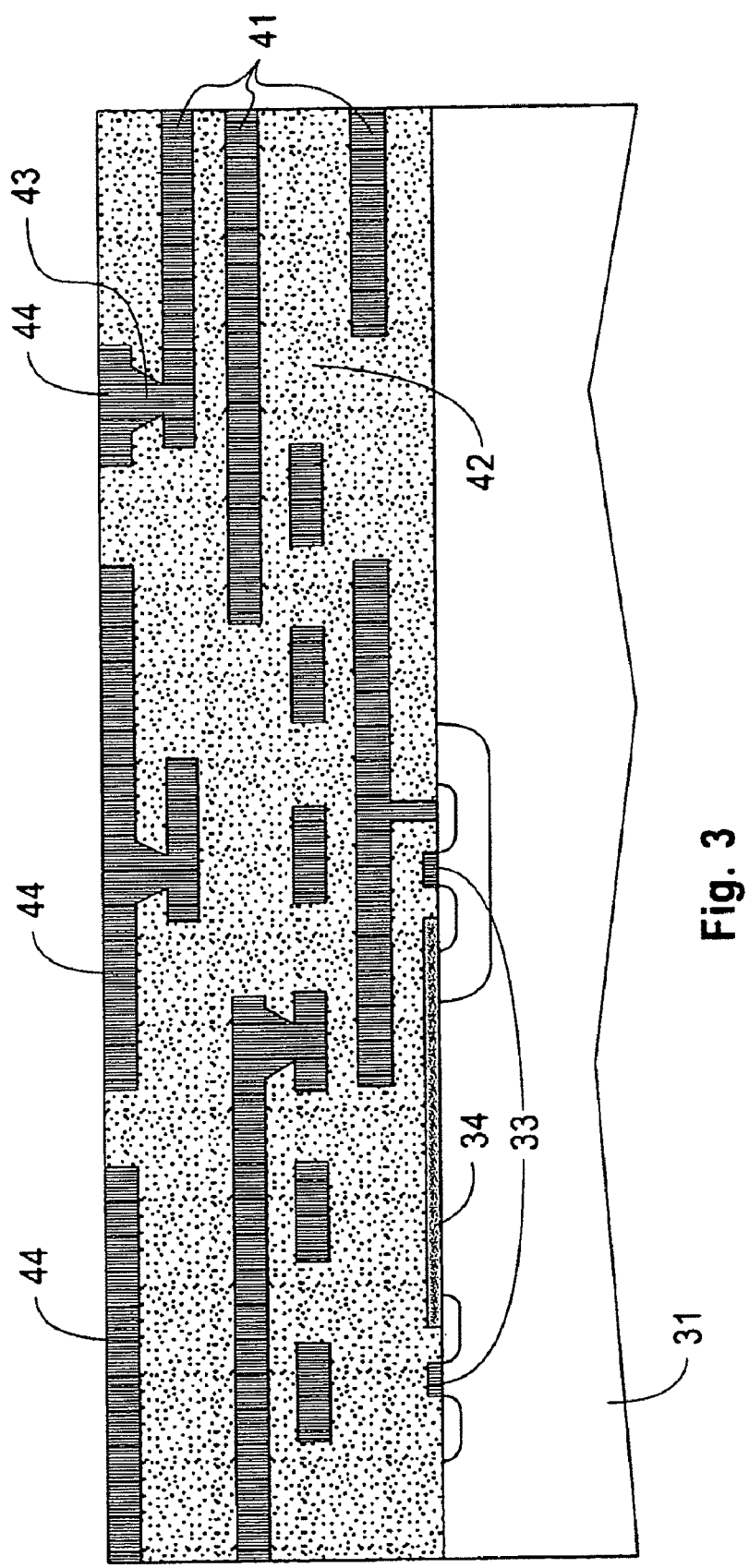
FIGS. 3-11B show cross sectional views of the device at various stages of fabrication.

FIG. 3 shows the device after the completion of the fabrication of the metal interconnects used to join active and passive devices in an integrated circuit. Interconnecting wires 41 may be made of Al, AlCu, Cu, W, or any conductive material or combination of such materials commonly in use in IC fabrication. Inter-level vias 43 are similarly comprised. Inter- and intra-level dielectrics (ILD) 42 may be comprised of $SiO_2$, SiN, SiON, any of a variety of organic insulators, or other insulating material or combination of such materials commonly in use in IC fabrication. The number of layers of interconnecting wires 41, inter-level vias 43, and ILD layers 42 shown in FIG. 3 is arbitrary. Any number of layers, including none, may be used. These layers may be deposited and patterned according to any method commonly in use in IC fabrication.

A final conducting layer 44 is then deposited and patterned. Conducting layer 44 will form the input and output electrodes of the electrical connection to, and the physical anchor points for the MEMS resonator or filter. Conducting layer 44 may or may not be also used as an interconnect level in the integrated circuit. Conducting layer 44 may be comprised of Al, AlCu, Cu, W, or any conductive material or combination of such materials commonly in use in IC fabrication, with the caveat that if a material such as Cu that oxidizes readily is used, conducting layer 44 should have a relatively non-reactive conductive material coating its top surface. As long as the base or coating material will develop less than a few 10s of nm of oxide in the presence of an oxygen plasma, it will be satisfactory for the operation of the MEMS resonator or filter. Otherwise, the coating material should be a noble metal such as Au, Pt, Pd, Ir, Rh, or Ru. Conducting layer(s) 44 may be deposited by any means commonly used in IC fabrication, including but not limited to sputter deposition, CVD, PECVD, evaporation, or electroplating, as long as that deposition method does not exceed the maximum allowable temperature $T_{max}$ which existing interconnect layers 41, vias 43, and ILD 42 can withstand. Similarly, the intra-level dielectric surrounding conducting layer 44 should not be etched by an oxygen plasma; if this is the case then this intra-level dielectric should be coated with another insulating material such as $SiO_2$, SiN, SiON, or the like. In the preferred embodiment, the wafer surface is planar after the construction of conducting layer 44. This planarization may be achieved through chemical-mechanical polishing (CMP) or other method commonly in use for IC manufacturing.

Figure 4:
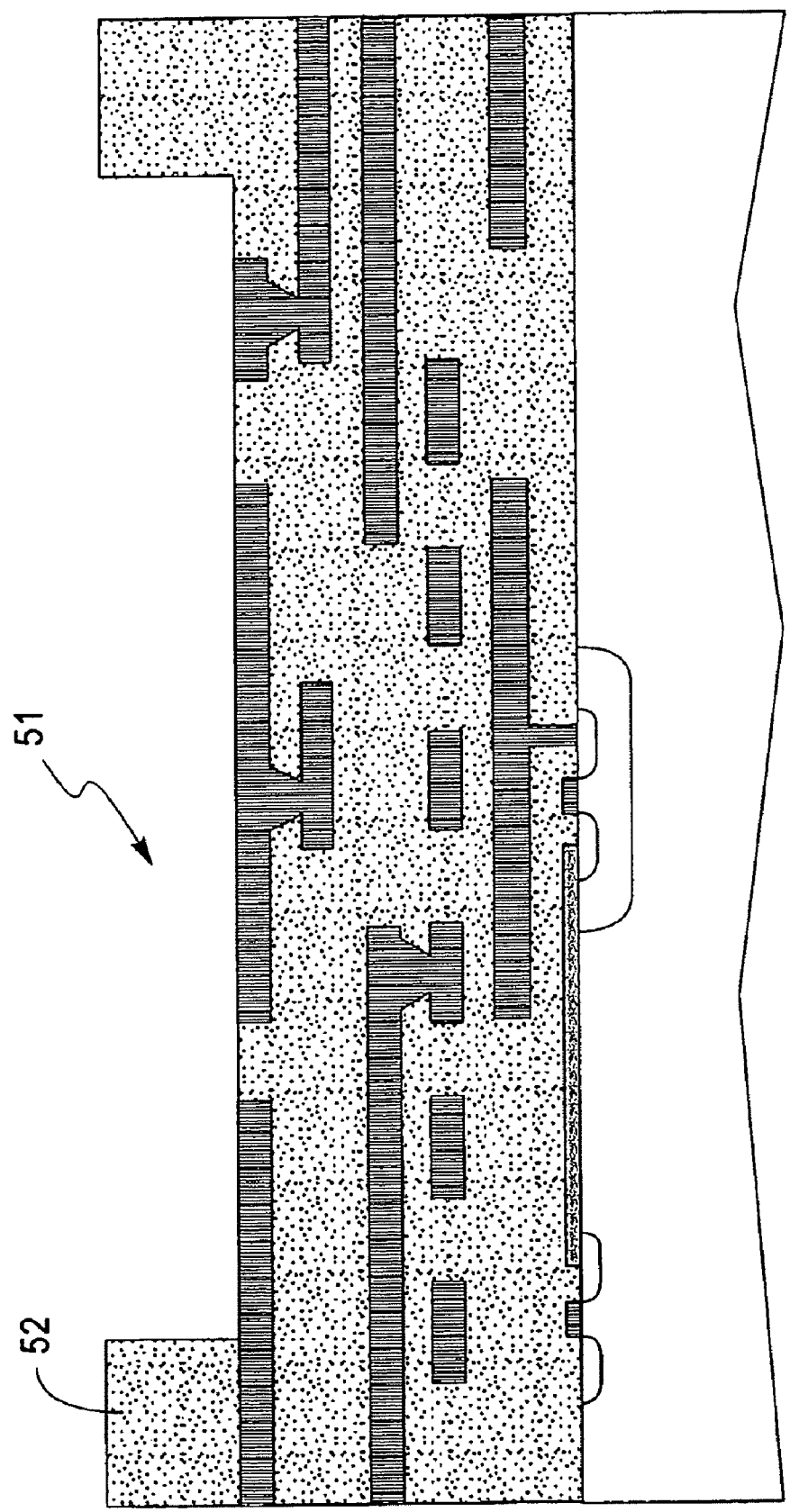

FIG. 4 shows the formation of a cavity 51 in which the MEMS resonator or filter will be constructed. The cavity material 52 is first deposited by a means such as plasma-enhanced chemical vapor deposition (PECVD) or other method (e.g. sputtering, spin-on, etc.) that keeps the temperature below $T_{max}$. In the preferred embodiment, the cavity material should be a layer or set of layers of an insulator which will not be etched by an oxygen plasma, such as $SiO_2$, SiN, SiON, or the like. The cavity 51 is patterned by any typical method, such as reactive ion etching (RIE) or wet chemical etching.

Figure 5:
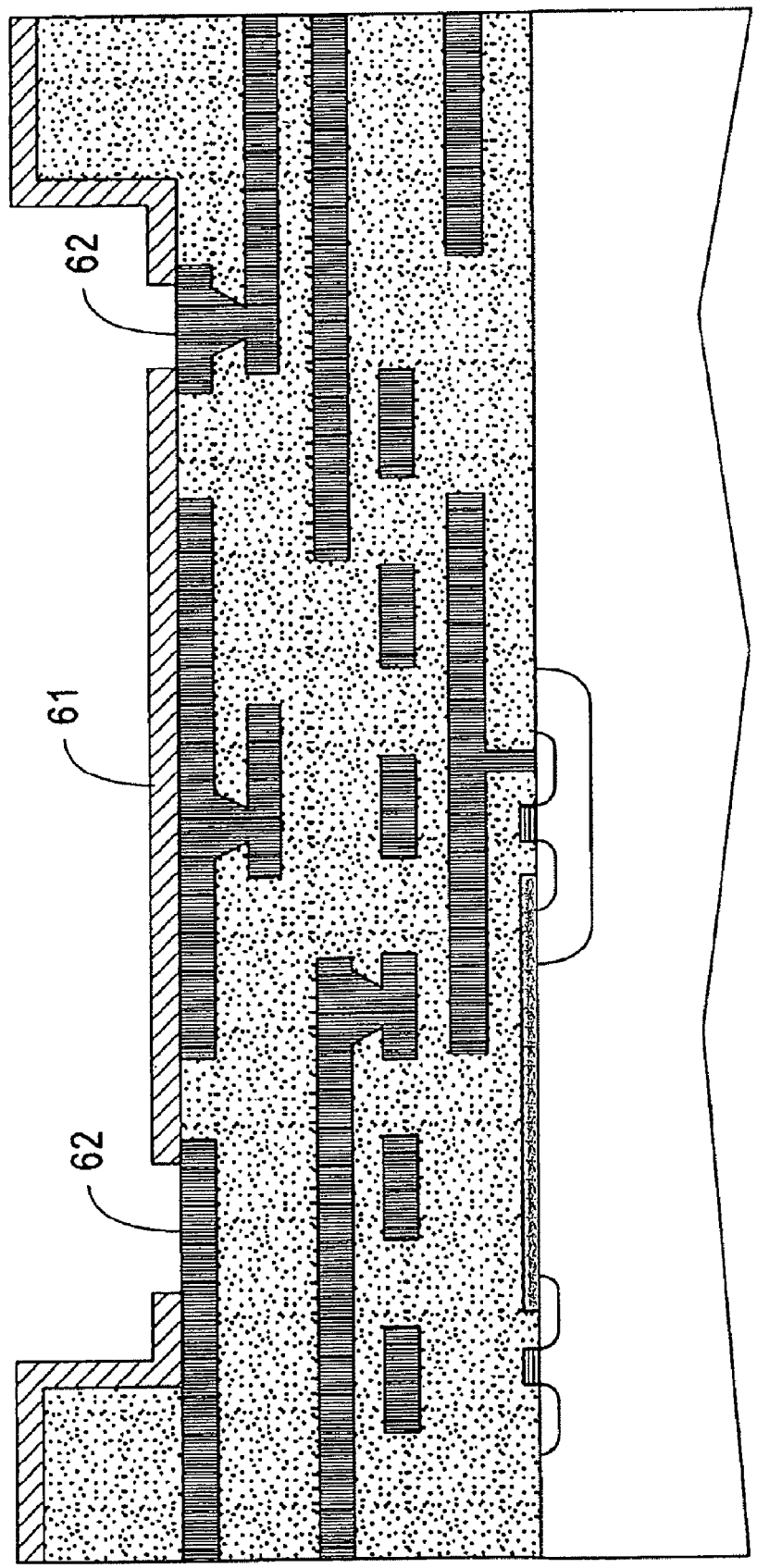

In FIG. 5, a layer of sacrificial material 61 is deposited and patterned to expose anchor points 62. The space occupied by sacrificial layer 61 will later form the gap between the input or output electrodes and the resonating member of the MEMS resonator or filter. As such, sacrificial layer 61 should be made the same thickness as the desired gap spacing. We propose the use of carbon-based materials that can be easily removed in an oxygen-based dry chemistry or alternatively by annealing in the presence of oxygen ($O_2$) gas at temperatures less than 400° C. (typical $T_{max}$). As carbon is readily removed with O2 plasma ashing or $O_2$ annealing, no aqueous solutions are necessary. Thus, concerns about stiction are alleviated. Additionally, in the $O_2$ ashing or annealing environment, most materials (with the exception of carbon-based materials) do not exhibit any significant etch rates. Therefore, the use of carbon-based release layers will allow for a greater flexibility of material choices for MEMS devices. The carbon-based release layer 61 can be deposited by a variety of methods, including but not limited to PECVD, evaporation, sputtering, and spin-on techniques. The choice of deposition technique generally relates to other structural requirements such as conformality, thickness control, and thermal stability of the sacrificial layer. The type of material can be any solid form of C, CH, CHO, or CHON. During the patterning of sacrificial layer 61 to form anchor points 62, it may be necessary or desirable to use a secondary hard mask of metal, silicide, or other dielectric layers.

Next the materials that comprise the resonating member of the MEMS resonator or filter are deposited and patterned. In the preferred embodiment shown in FIG. 6A, the resonating member is comprised of a thin layer of conductive material 70 followed by a thick structural layer 71. Conductive layer 70 is used so that electrical contact to the resonating member may be made, and so that electrostatic actuation between the input or output electrode 75 and the resonator may be achieved. Because good conductors such as metals and silicides typically have very high density ($\rho$), and low density materials are more desirable for achieving high resonant frequencies, the conducting layer 70 is made very thin. Any material that has good conductivity may be used, with the caveat that if a material such as Cu that oxidizes readily is used, conducting layer 70 should have a relatively non-reactive conductive material coating its lower surface. As long as the base or coating material will develop less than a few 10's of nm of oxide in the presence of an oxygen plasma, it will be satisfactory for the operation of the MEMS resonator or filter. Otherwise, the coating material should be a noble metal such as Au, Pt, Pd, Ir, Rh, or Ru.

Because many dielectric materials have an excellent $E/\rho$ ratio for achieving high frequency operation of the MEMS resonator or filter, the bulk structural material 71 of the resonating member is comprised of dielectric in the preferred embodiment. Any material that is not etched or significantly altered by $O_2$ plasma may be used; however aluminum nitride (AlN), aluminum oxide ($Al_2O_3$), silicon nitride ($Si_3N_4$), tantalum silicon nitride (TaSiN), and many piezoelectric materials make excellent choices. The material in layers 70 and 71 may be deposited by any typical means whose temperature does not exceed $T_{max}$, for example PECVD, sputtering, evaporation, electroplating, etc. The resonating member is then patterned, typically by RIE.

Figure 6A:
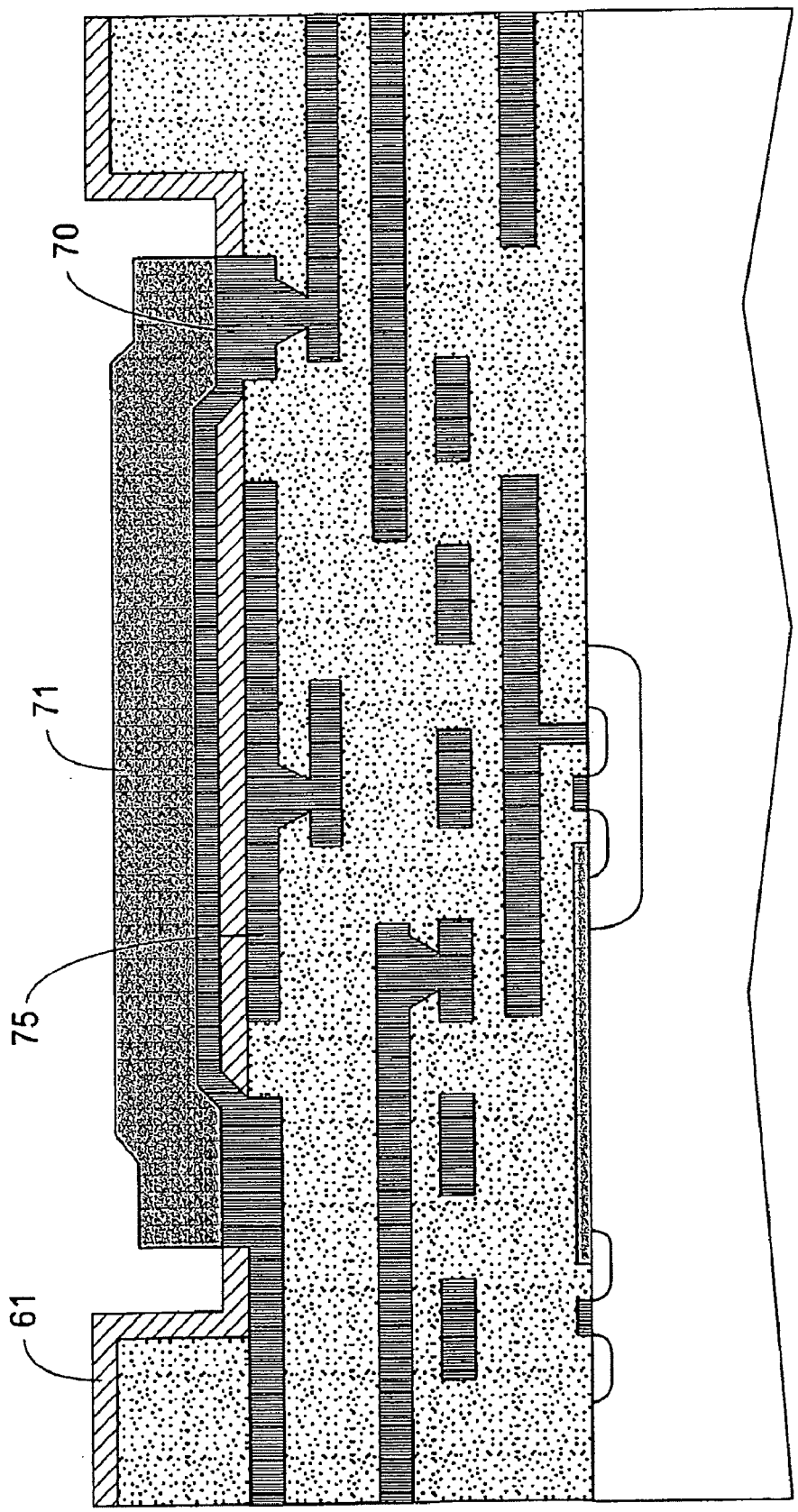
Figure 6B:

FIG. 6B shows an alternative embodiment in which the entire thickness of the resonating member is made of conductive material 70. This may be done, for example, when creating a MEMS resonator or filter whose vibration is in the lateral direction, such as a comb filter. The drawback to this embodiment is the lower $E/\rho$ ratio and thus the lower $f_0$ of the MEMS resonator or filter.

Figure 6C:
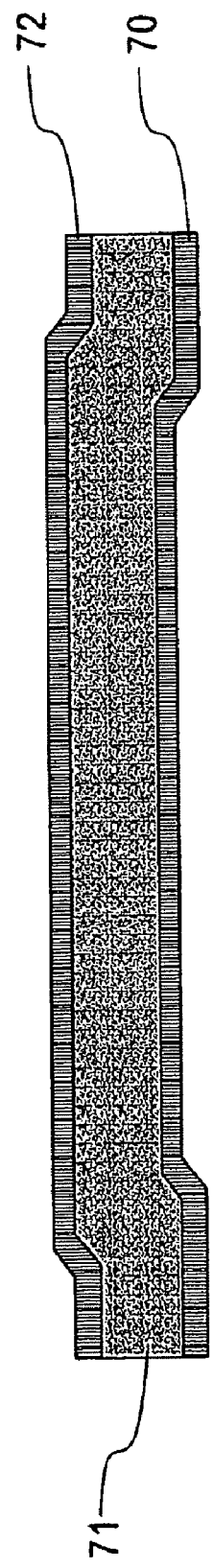

FIG. 6C shows an alternative embodiment in which the resonating member is comprised of more than two layers of material, for example a lower conductor 70, a structural layer 71, and an upper conducting layer 72. This may be done to offset performance effects due to the differing thermal coefficients of expansion of the different layers in the resonating member. Although only three layers are shown in FIG. 6C, any number of layers may be used, and any materials may be used for the different layers, as long as at least one conducting layer is used, and all materials obey the processing temperature restrictions and show good resistance to etching by oxygen plasma.

Figure 7:
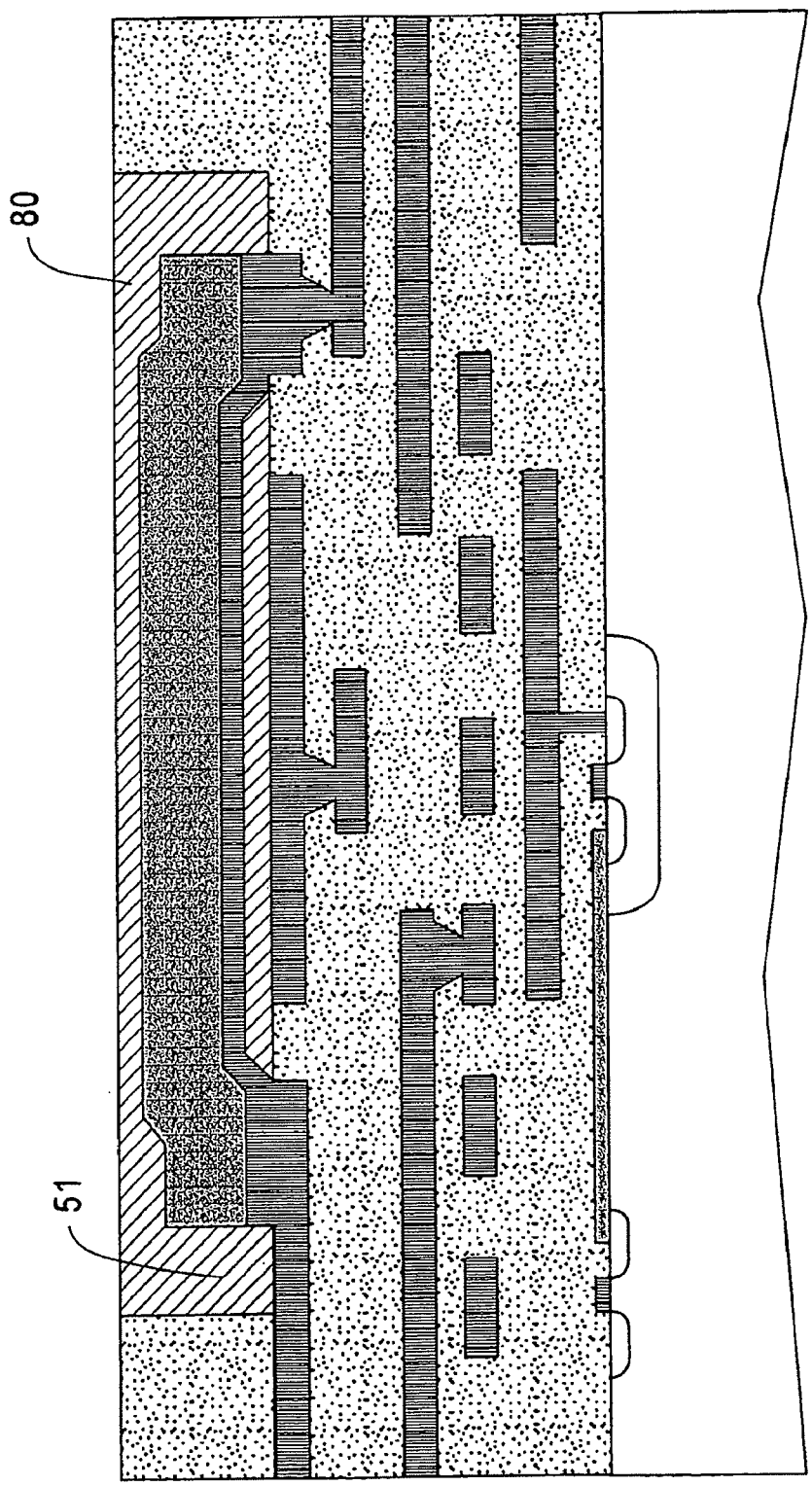

Following the deposition and patterning of the resonating member, the remainder of cavity 51 is filled in with additional sacrificial material 80 (FIG. 7). This material may be the same as or different from the sacrificial layer 61 shown in FIG. 5, as long as it is also a carbon-based material which is easily removed in an oxygen plasma or by annealing in an oxygen ambient. The same material and deposition method choices apply. Following deposition of additional sacrificial material 80, the entire structure is planarized by a method such as CMP. This step may not be necessary if the material chosen for sacrificial material 80 has self-planarizing properties.

Figure 8:
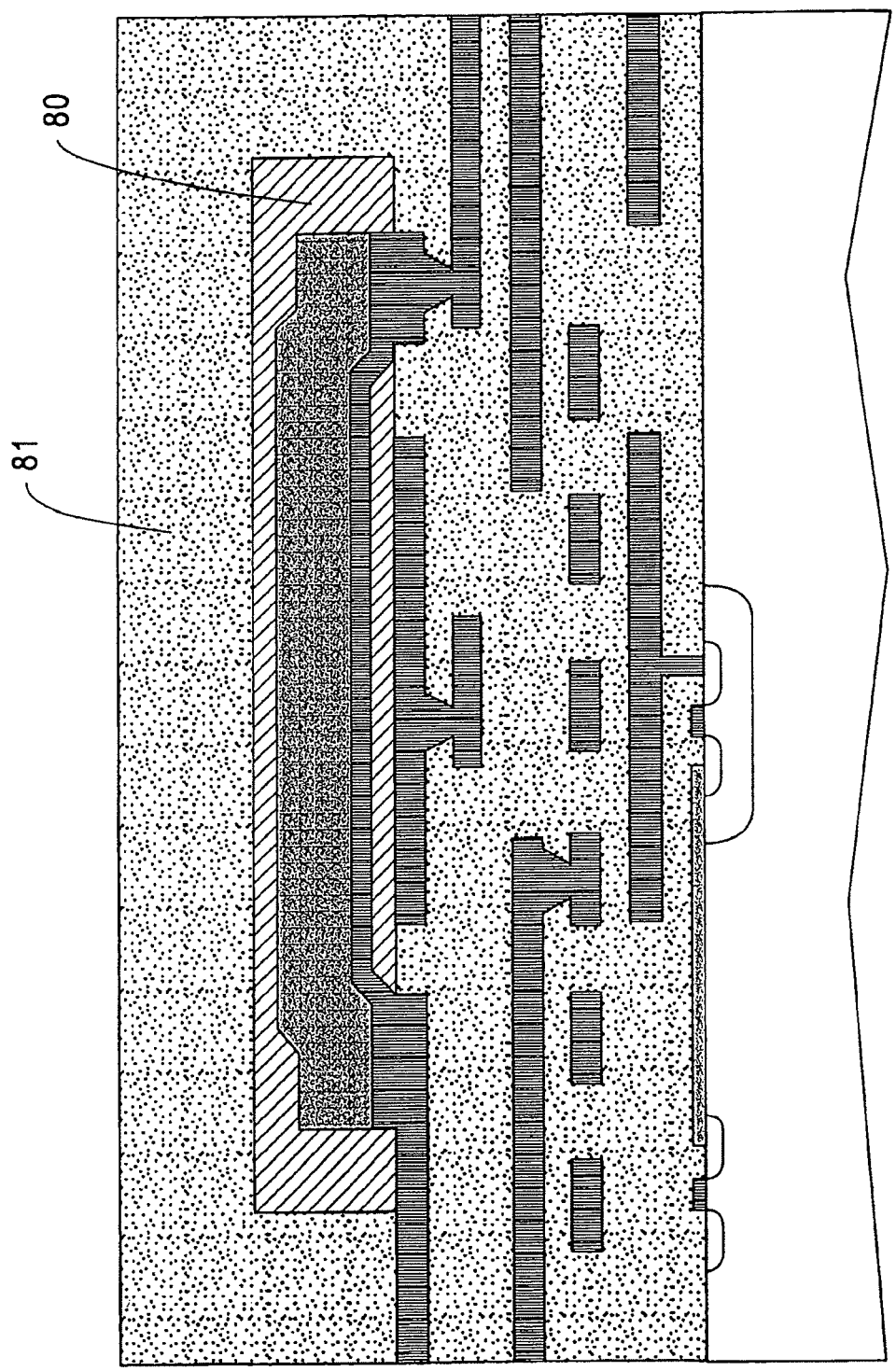
Figure 9:
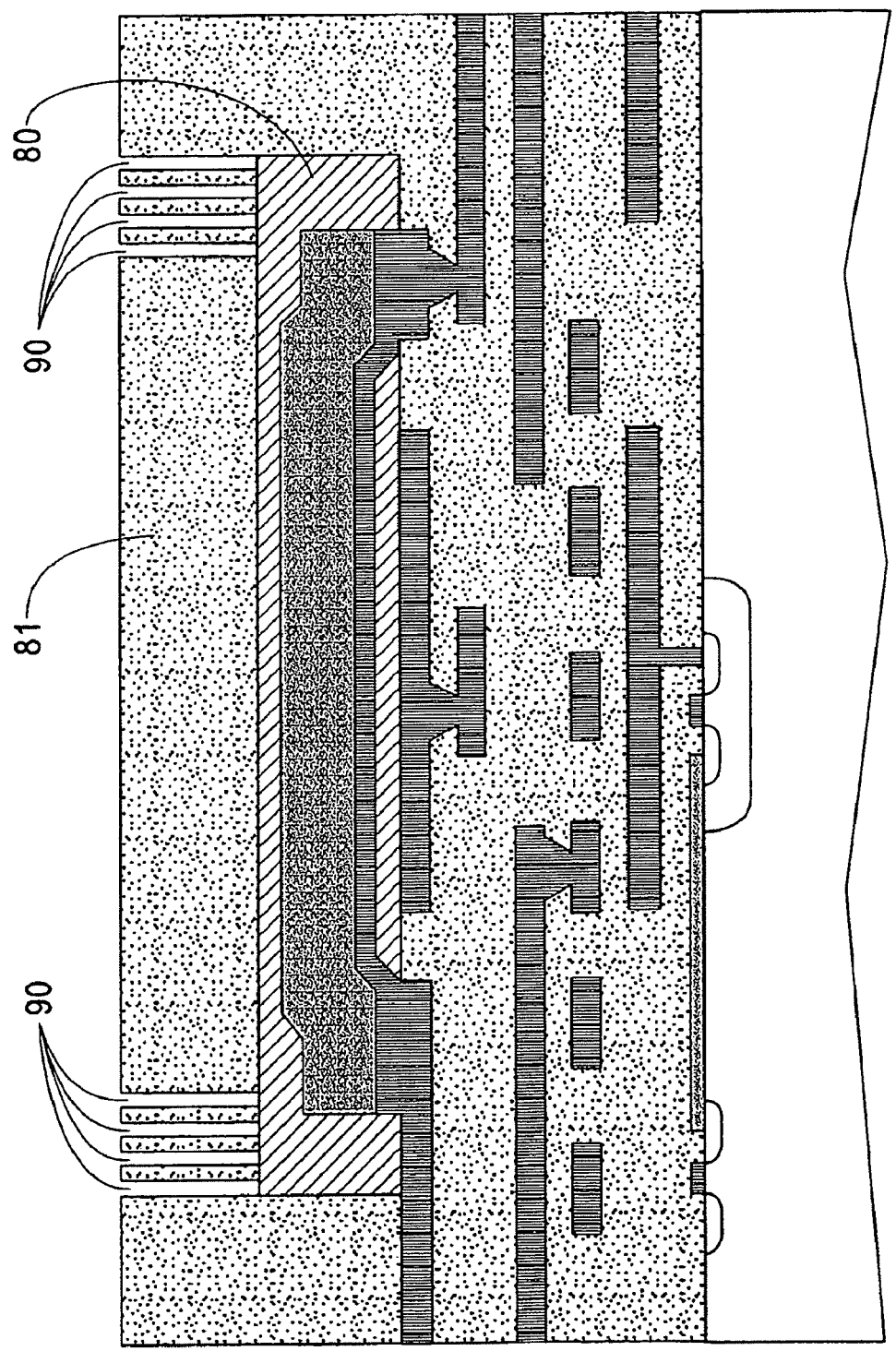
Figure 10:
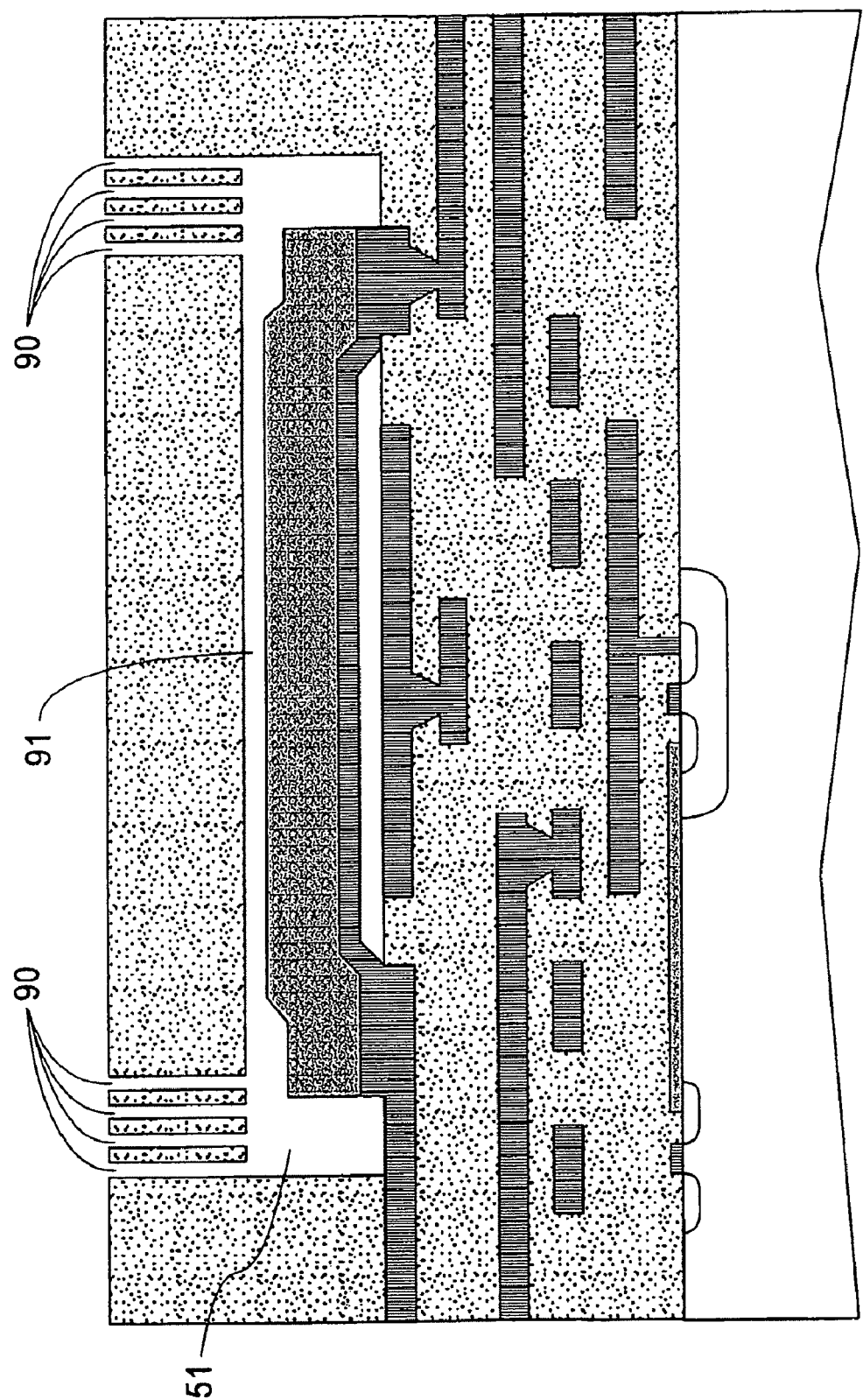

In FIG. 8, the entire structure is then capped with additional dielectric layer(s) 81. Although a single layer is shown in FIG. 8, multiple layers may be employed. This layer or layers may be comprised of $SiO_2$, SiN, SiON, or the like, as long as these layers are not etched by an $O_2$ plasma, and these layers may be deposited by any typical means such as PECVD. Subsequently (FIG. 9), very small via holes 90 are etched in this cavity "ceiling" by RIE, thereby exposing sacrificial material 80.

Next (FIG. 10), the sacrificial material above, surrounding, and below the MEMS resonator or filter is removed via an $O_2$ ashing step, or by annealing in the presence of $O_2$ gas at temperatures less than $T_{max}$. This procedure again reveals cavity 51 and creates air gap 91. Now the resonating member of the MEMS resonator or filter is free to move except at the anchor locations. Due to the ease of removal of the sacrificial material with this process, very small gaps on the order of 100 nm can be achieved. Since no rinsing of reagents or etch by-products is required, problems with stiction are eliminated.

Figure 11A:
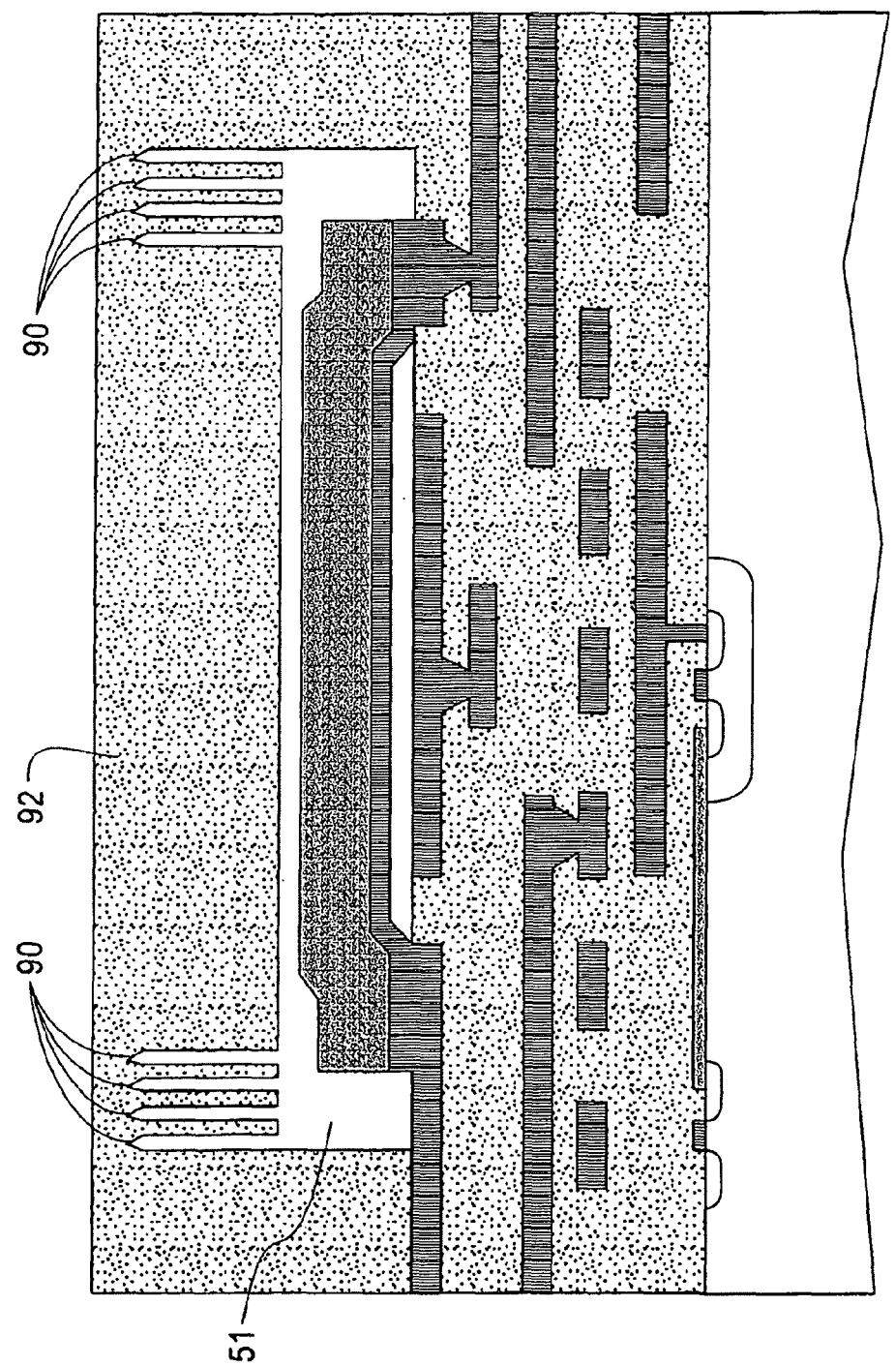
Figure 11B:
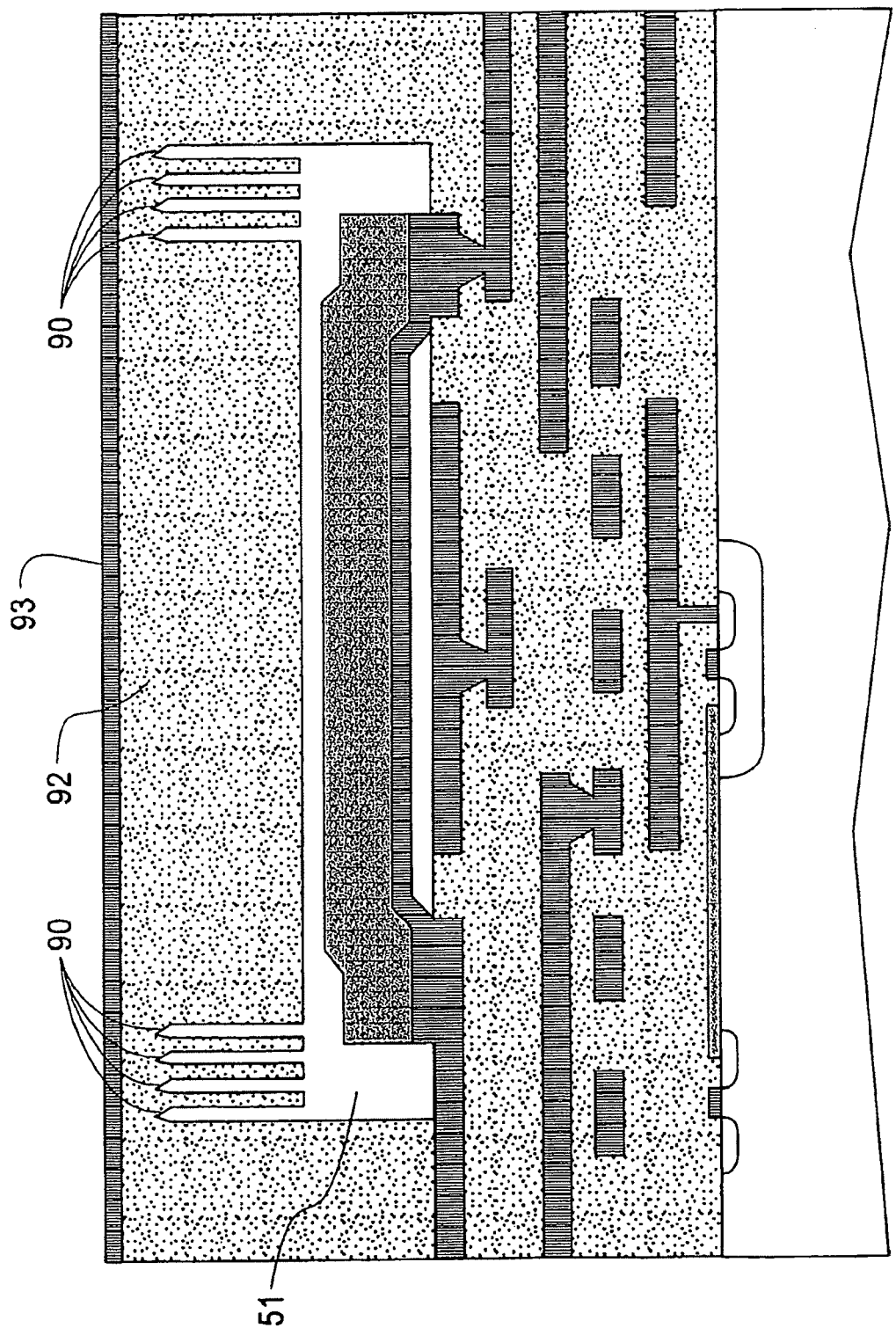

The structure is then coated with additional dielectric layer(s) 92 as shown in FIG. 11A in a two-step process. In the first phase, non-selective PECVD is used to partially seal off release vias 90. The poor conformality of this process works in our favor in this case to rapidly pinch off the release vias while depositing very little material inside vias 90 or cavity 51 itself. Both the aspect ratio of release vias 90 and the parameters of the PECVD process can be optimized to minimize deposition of unwanted material within cavity 51. In the second phase of the process, via holes 90 are finally and completely sealed in a physical vapor deposition process such as evaporation or sputtering, wherein the ambient pressure is around 10 mT or less. This is an order of magnitude lower than the pressure required for optimum performance of MEMS resonators and filters. If pressure this low is not required for device operation, the entire pinch-off procedure can be done in a single PECVD step. In the preferred embodiment, the release process and the pinch-off process are accomplished in the same manufacturing tool so that the devices do not need to be exposed to the ambient in between. If necessary, a forming gas anneal can be performed between these two steps (release and pinch-off) to reduce any metal oxides formed on the surfaces of the electrodes or resonating member of the MEMS resonator or filter. Since the material used for the pinch-off process, typically $SiO_2$, SiN, SiON or some combination of these, may not provide a long-term hermetic seal for the MEMS device, the alternative embodiment shown in FIG. 11B demonstrates a metal "lid" 93 used to prevent diffusion, particularly of water vapor, through the cavity ceiling. In an alternative embodiment, the vacuum encapsulation process presented here could be further combined with other techniques such as eutectic bonding to another substrate, etc., to gain additional protection for the MEMS device.

Figure 12:
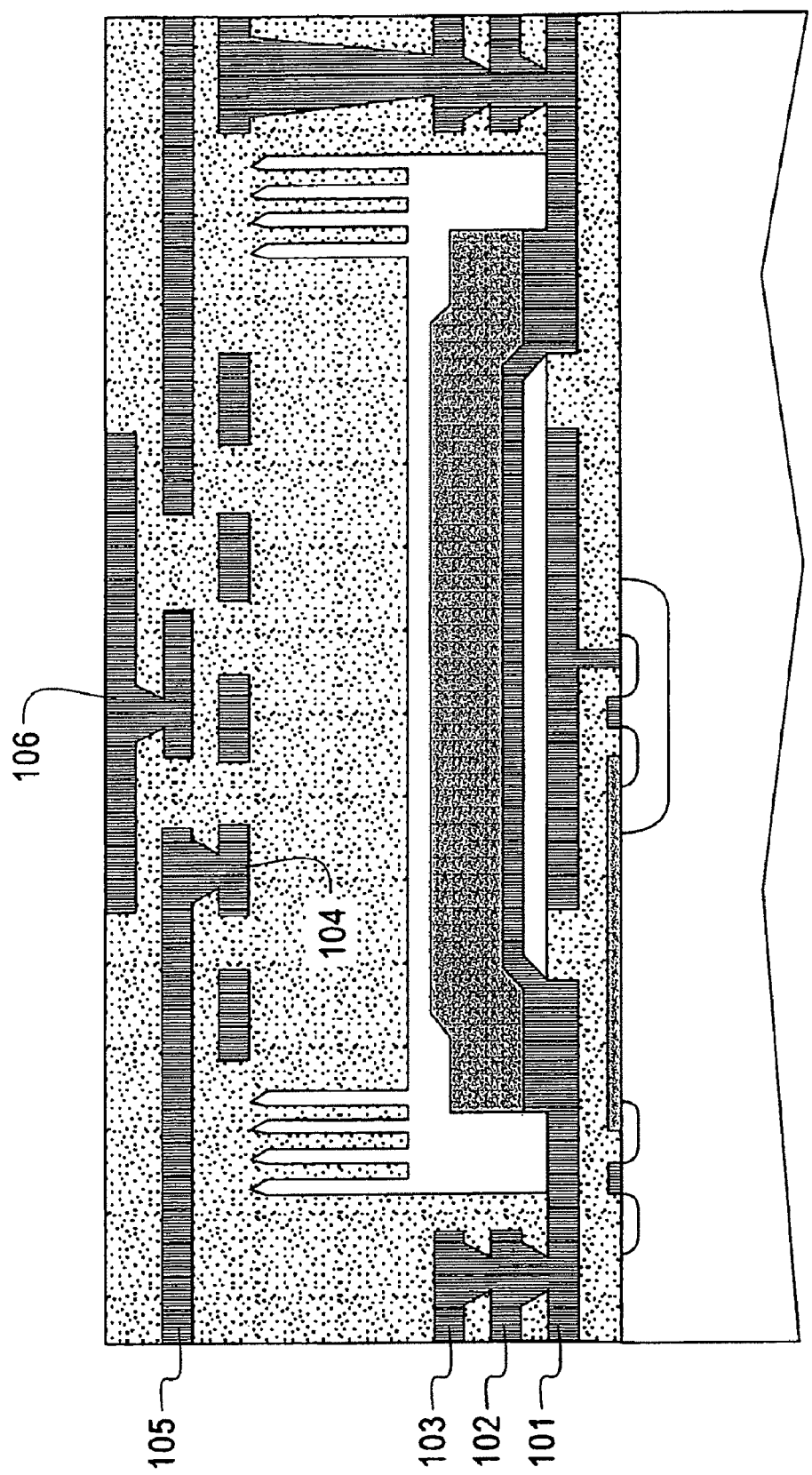
FIG. 12 shows an alternative embodiment in which the MEMS resonator or filter has been incorporated into the interconnect layers rather than added afterward.

FIGS. 3-11 showed the preferred embodiment of a MEMS resonator or filter that was fabricated after the completion of all the processing steps required for IC fabrication. An alternative method is to incorporate the fabrication of the MEMS device into the process steps used for formation of the interconnect layers. For example, in FIG. 12, a MEMS device is shown wherein the metal level that forms the input and output electrodes and electrical contact/anchors for the resonating member is shared with first interconnect metal 101. The material that comprises the cavity is the same as the inter-level dielectrics that insulate interconnect metals 102 and 103. Interconnect metals 104, 105, and 106 are formed after the completion of the fabrication and encapsulation of the MEMS resonator or filter. The number of metal levels shown in the example in FIG. 12 is arbitrary, as is the placement of the MEMS device among them. That is, fabrication of the MEMS device could have just as easily begun with interconnect metals 102 or 103, etc.

Figure 13A:
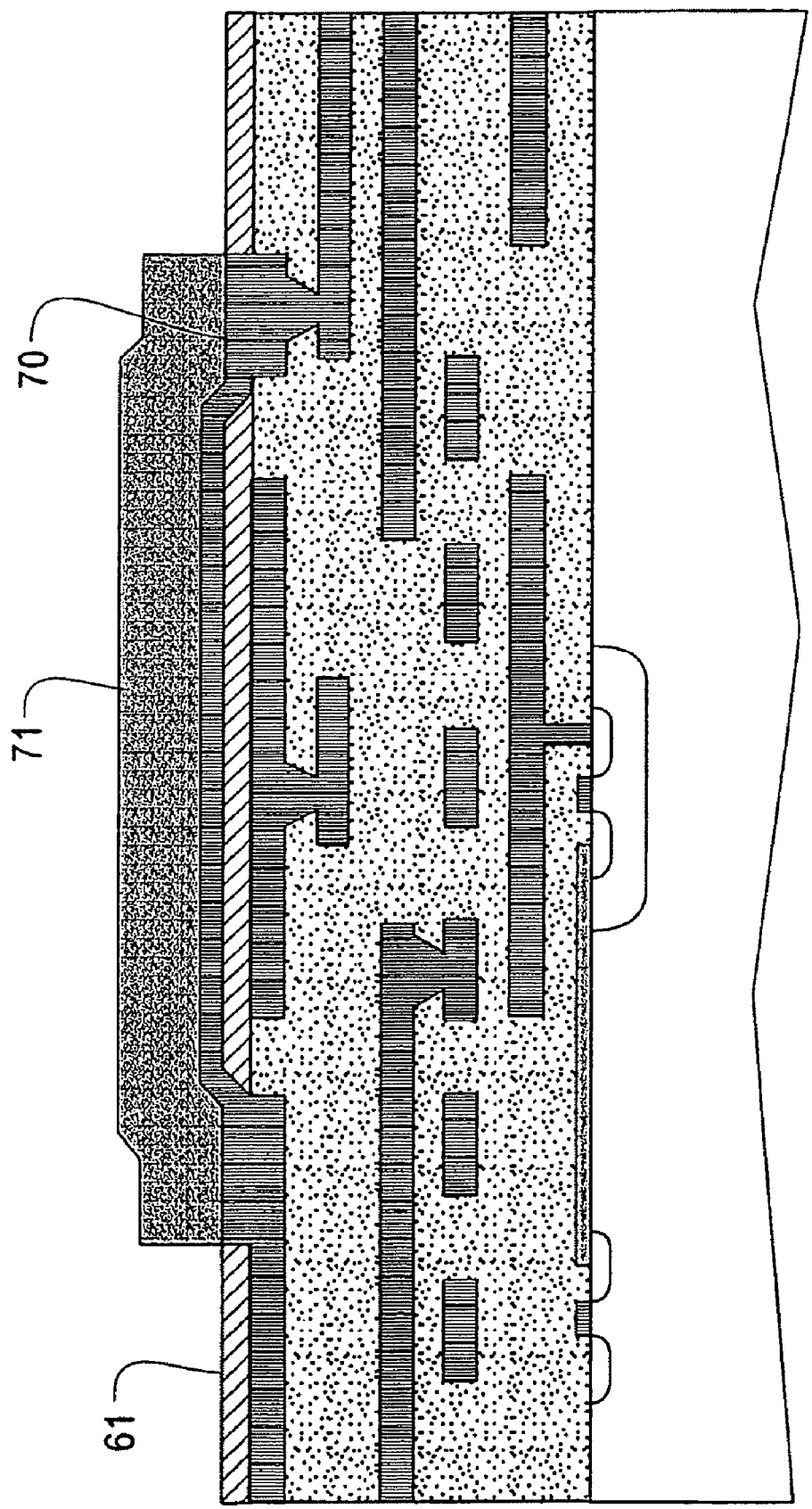
FIGS. 13A-D show an alternative embodiment in which the MEMS resonator or filter has been fabricated on a planar surface rather than in a cavity and the encapsulation provided subsequently.
Figure 13B:
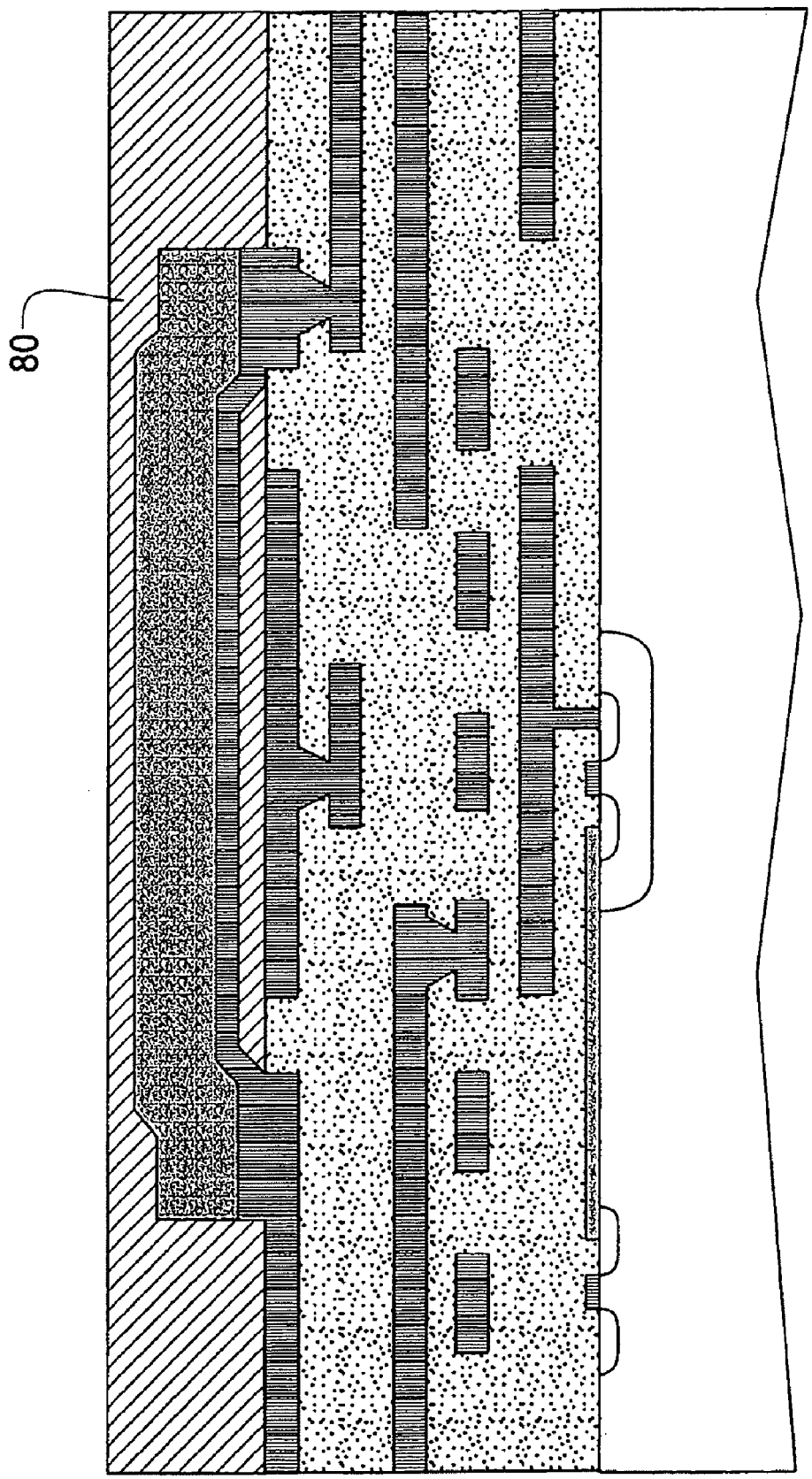
Figure 13C:
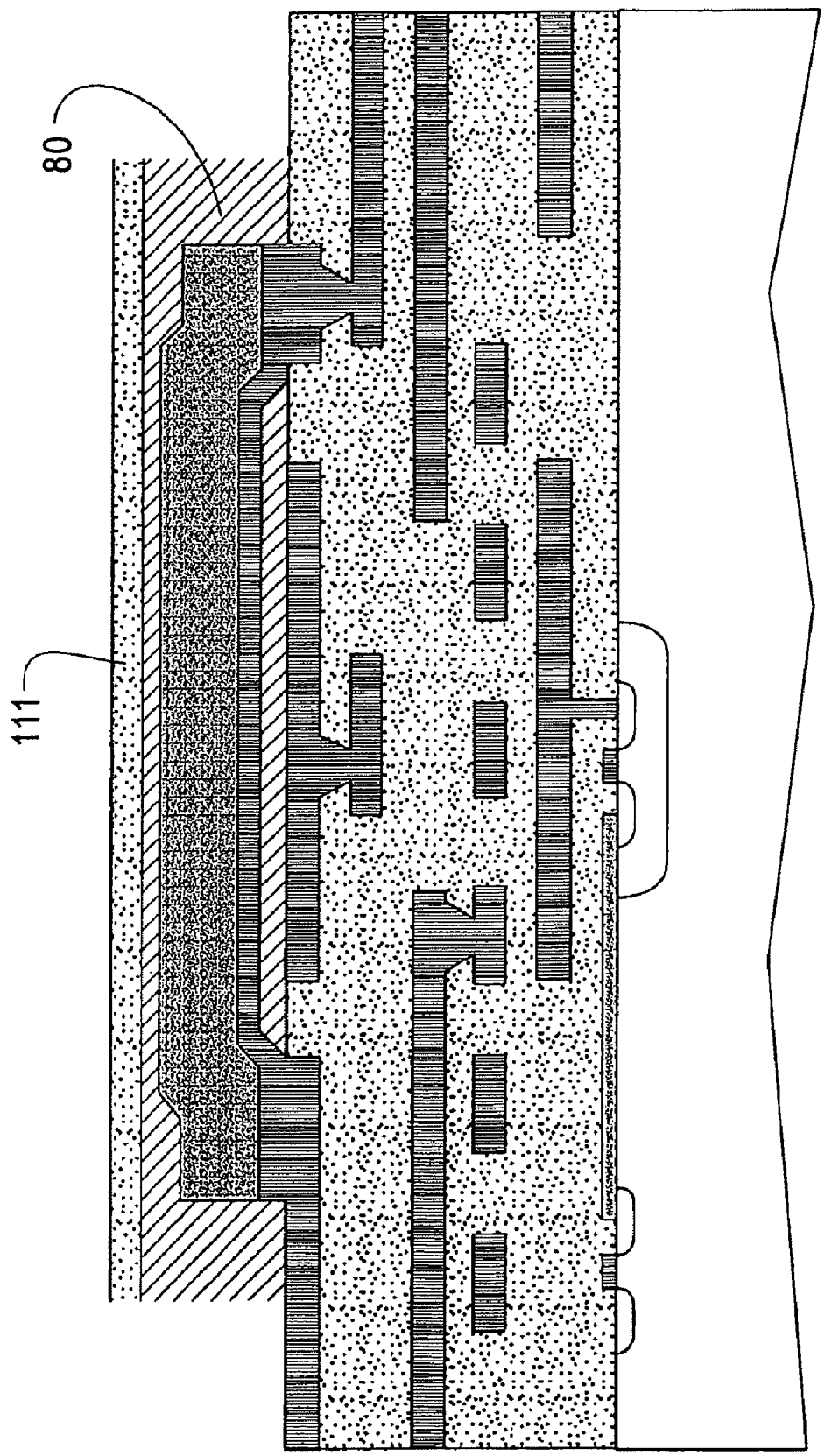
Figure 13D:
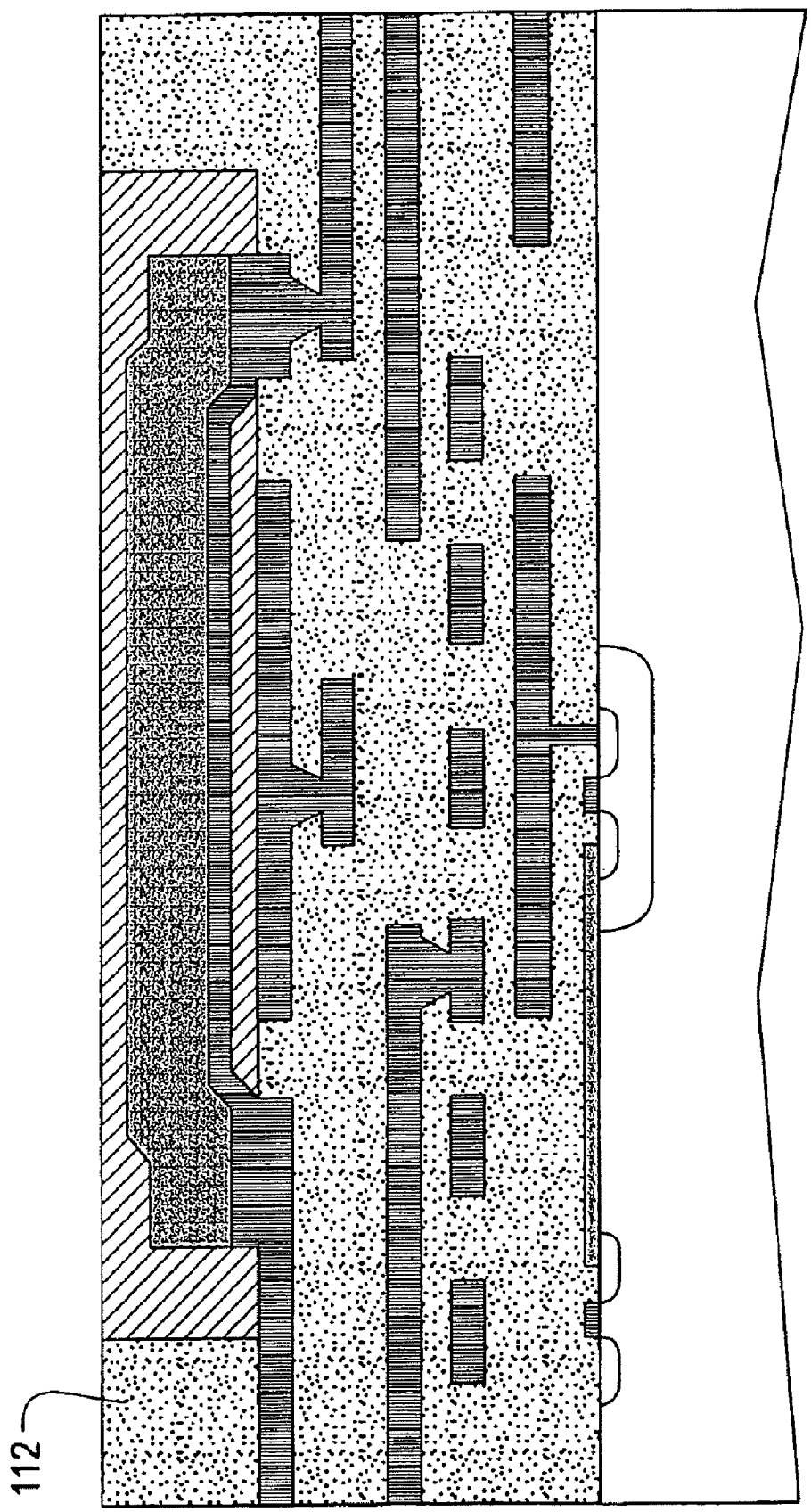

In another alternative embodiment, the MEMS resonator or filter is not fabricated in a cavity 51 as shown in FIG. 4. Instead, the MEMS resonator or filter is first constructed on a planar surface, and then the encapsulation procedure is executed afterward. In FIG. 13A, sacrificial layer 61 has been deposited and patterned as in FIG. 5, and resonating structure materials 70 and 71 have been deposited and patterned as in FIG. 6A. The difference is that cavity 51 is missing. In FIG. 13B, additional sacrificial material 80 has been deposited and planarized as in FIG. 7. Again, however, cavity 51 is not present. In FIG. 13C, hard mask 111, typically consisting of layers of $SiO_2$, SiN, or SiON, has been deposited and patterned. The pattern has been transferred to sacrificial material 80. In FIG. 13D, additional dielectric material 112, again typically consisting of $SiO_2$, SiN, SiON, or some combination of these, has been deposited and the entire structure planarized by a process such as CMP. The difference between FIG. 13D and FIG. 7 is that the CMP process of FIG. 13D planarized an inorganic dielectric, and the CMP process of FIG. 7 planarized the carbon-based sacrificial material. Subsequent to FIG. 13D, the rest of the process is as from FIG. 8 onward. The choice of which embodiment to pursue will depend on factors including the lithography and CMP capabilities of the manufacturing line.

Figure 14A:
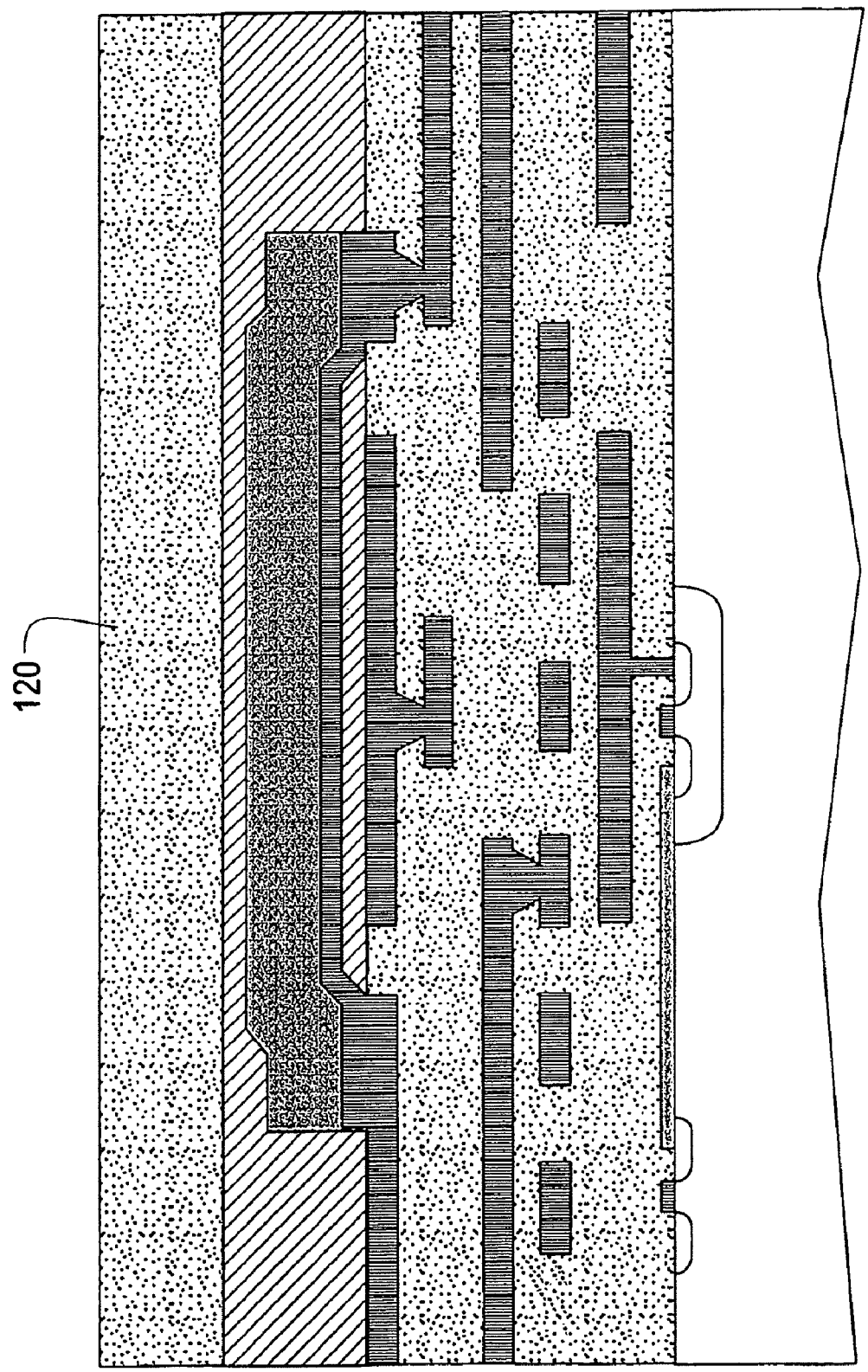
FIGS. 14A-C show an alternative embodiment in which the cavity material and sacrificial encapsulating material are shared.
Figure 14B:
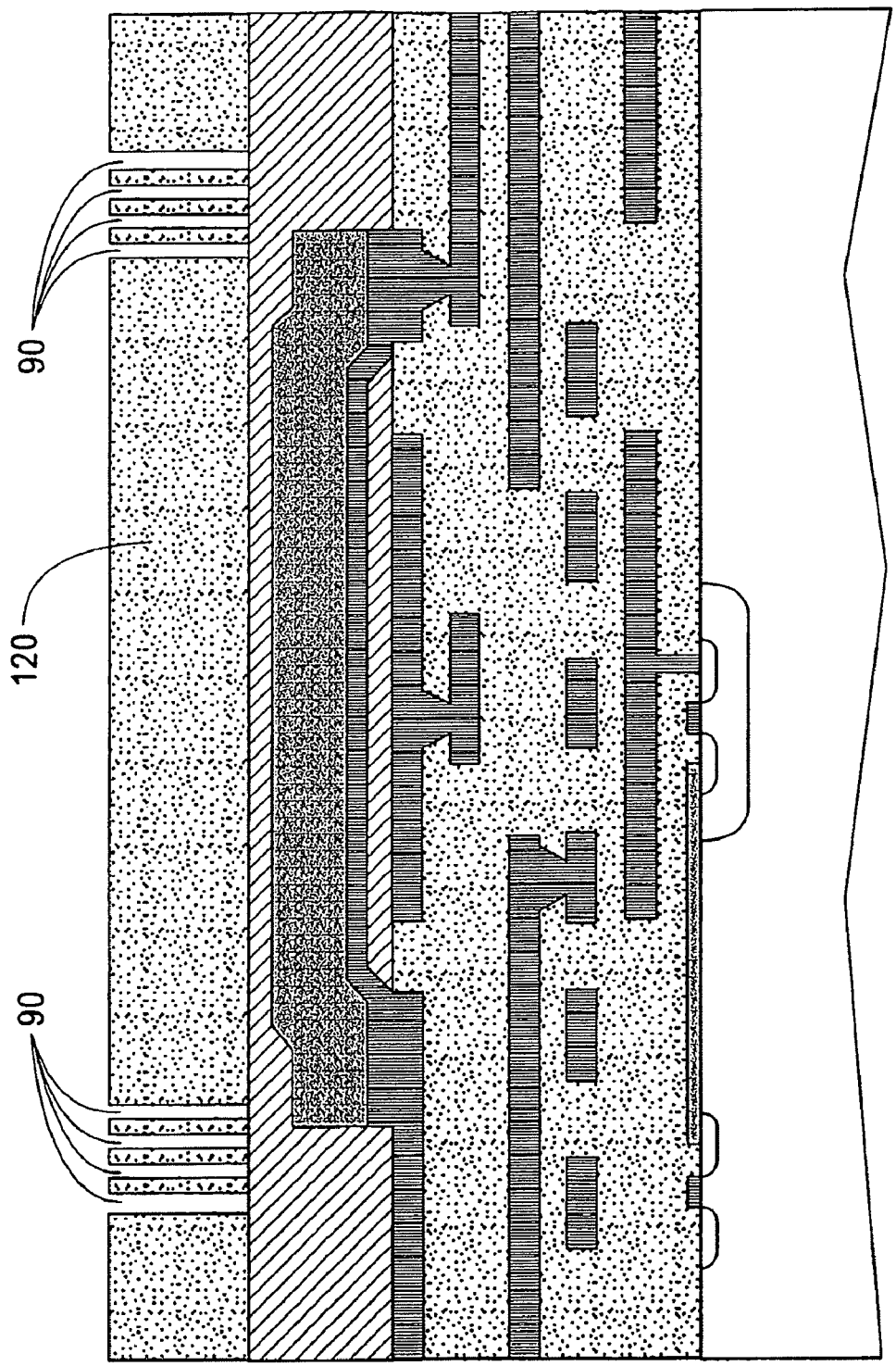
Figure 14C:
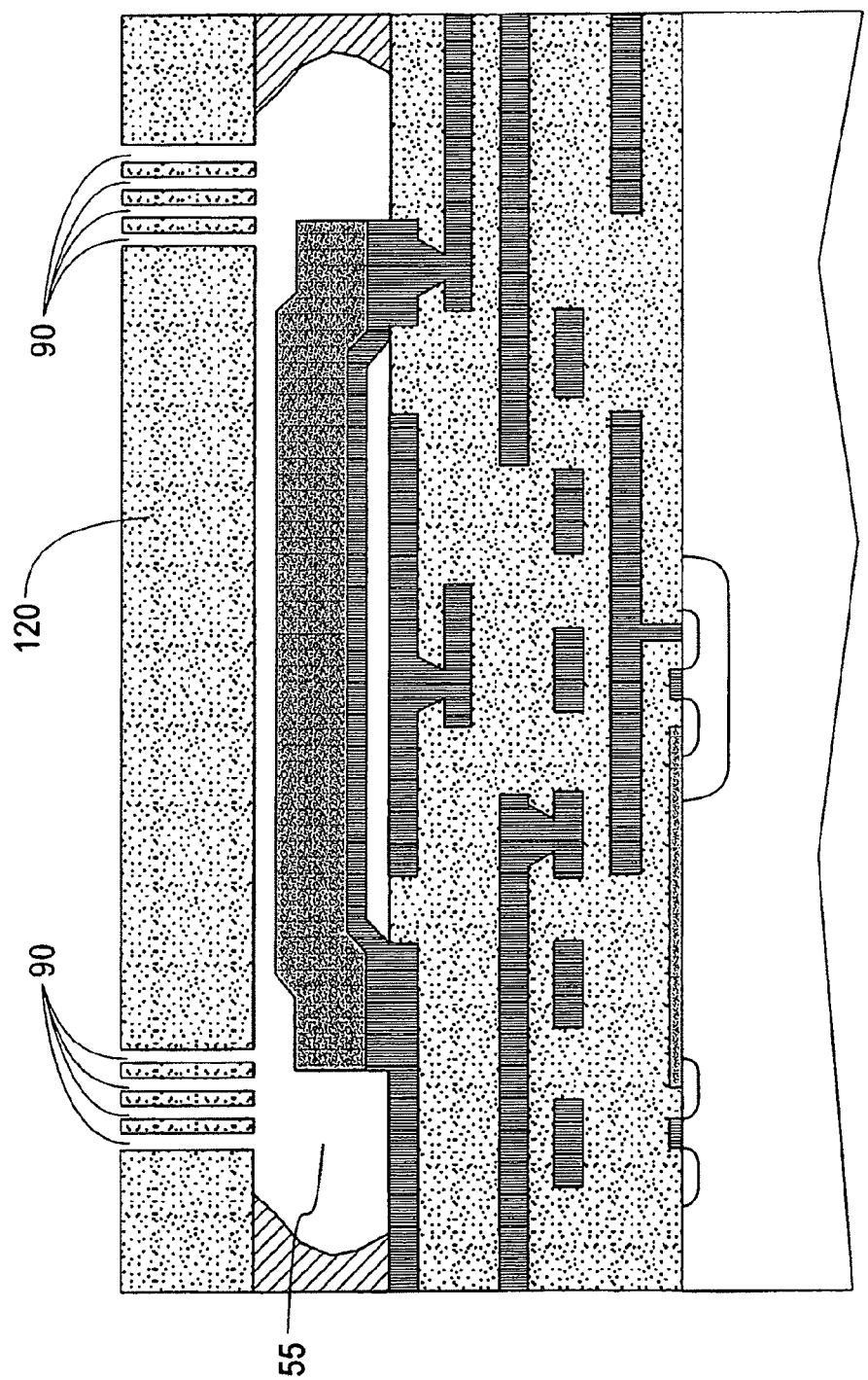

FIGS. 14A-C show an alternative embodiment in which the MEMS device is constructed on a planar surface, and the sacrificial material is one and the same as the "cavity" material. Assuming that the process steps which lead up to FIG. 13B are followed, in FIG. 14A a thick dielectric membrane 120 is deposited over the entire structure. Via holes 90 are then etched through dielectric layer 120 (FIG. 14B). When the release process is executed, "cavity" 55 of FIG. 14C results due to the isotropic nature of the $O_2$ plasma etch or the anneal in $O_2$ containing ambient. The extent of lateral etch will depend on the etch rate of the carbon-based sacrificial material and the time required to free the MEMS structure. The lateral etch will not be problematic as long as appropriate design ground rules are enforced in laying out the design.

Although the process described herein was developed particularly for the fabrication of MEMS resonators and filters, it should be noted that the methods, particularly of release and encapsulation, could be equally well applied to other types of MEMS devices. For example, device shown in cross section in FIG. 11A could function as a metal-metal contact switch (MEMS switch) if the applied DC voltage between the resonating member and the input or output electrode were sufficiently high.

The preferred embodiment used carbon-based release layers and an $O_2$ plasma release process for reasons stated earlier. However, the combined release-and-encapsulation process could also be applied to other material sets, as long as compatibility requirements are met. The basic process involves forming a cavity in a material, filling the cavity with a material readily removable without significant etching of the material surrounding the cavity, capping the cavity with another material not readily removed when removing the material inside the cavity, patterning small holes in the material capping the cavity, removing the material within the cavity through the holes in the capping material, and finally sealing the cavity with a vacuum coating process. Another sacrificial material that could be used with a metal/dielectric MEMS resonator or filter is sputtered or evaporated silicon, removed with a plasma containing xenon difluoride ($XeF_2$). Other combinations are possible as well.

While the presented invention has been described in terms of a preferred embodiment, those skilled in the art will readily recognize that many changes and modifications are possible, all of which remain within the spirit and the scope of the present invention, as defined by the accompanying claims.

What is claimed is:

1. A microelectromechanical system (MEMS) resonator or filter comprising:
    a first conductive layer;
    one or more electrodes patterned in said first conductive layer which serve the function of signal input, signal output, or DC biasing, or some combination of these functions;
    an evacuated cavity;
    a resonating member comprised of a lower conductive layer and an upper structural layer;
    a first air gap between said resonating member and one or more of said electrodes;
    an upper membrane covering said cavity; and
    a second air gap between said resonating member and said upper membrane.

2. The MEMS resonator or filter as recited in claim 1, wherein a DC potential difference is applied between said resonating member and one or more of said electrodes.

3. The MEMS resonator or filter as recited in claim 1, wherein an electrostatic attraction between said resonating member and one or more of said electrodes causes bending or displacement of said resonating member.

4. The MEMS resonator or filter as recited in claim 1, wherein an applied AC voltage to either said resonating member or to one or more of said electrodes modulates said displacement and causes vibration of said resonating member.

5. The MEMS resonator or filter as recited in claim 1, wherein said first conductive layer is made from Al, AlCu, Cu, W, Au, Pt, Pd, Ir, Rh, Ru, TiSi, TaSi, WSi, or CoSi, conductive oxides or nitrides thereof, with or without adhesion layers such as Ti, TiN, or TaN, or some combination of these.

6. The MEMS resonator or filter as recited in claim 1, wherein said first conductive layer is further passivated by a noble metal such as Au, Pt, Pd, Ir, Rh, or Ru.

7. The MEMS resonator or filter as recited in claim 1, wherein said first conductive layer is also used as a metal interconnect level in an integrated circuit.

8. The MEMS resonator or filter as recited in claim 1, wherein said first conductive layer is also used as a local interconnect level in an integrated circuit.

9. The MEMS resonator or filter as recited in claim 1, wherein said evacuated cavity is formed within a layer or layers of dielectric such as $SiO_2$, SiN, SiON, SiCH, SiCOH, or some combination of these.

10. The MEMS resonator or filter as recited in claim 1, wherein said evacuated cavity is formed within an arbitrary number of existing layers of inter-level dielectric in an integrated circuit process.

11. The MEMS resonator or filter as recited in claim 1, wherein said evacuated cavity is formed within a layer of sacrificial material to be removed at the time of cavity evacuation.

12. The MEMS resonator or filter as recited in claim 1, wherein said evacuated cavity is formed before the creation of the resonating member.

13. The MEMS resonator or filter as recited in claim 1, wherein said evacuated cavity is formed subsequent to the creation of the resonating member.

14. The MEMS resonator or filter as recited in claim 1, wherein said resonating member is comprised entirely of said lower conductive layer.

15. The MEMS resonator or filter as recited in claim 1, wherein said resonating member is comprised of a said lower conductive layer, a middle structural layer, and an upper conductive layer.

16. The MEMS resonator or filter as recited in claim 1, wherein said resonating member is comprised of any arbitrary number and combination of layers of said lower conductive layer and said middle structural layer.

17. The MEMS resonator or filter as recited in claim 1, wherein said lower conductive layer of said resonating member comprises Al, AlCu, Cu, W, Au, Pt, Pd, Ir, Rh, Ru, TiSi, TaSi, WSi, or CoSi, conductive oxides or nitrides thereof, with or without adhesion layers such as Ti, TiN, or TaN, or some combination of these.

18. The MEMS resonator or filter as recited in claim 1, wherein said lower conductive layer of said resonating member is further passivated by a noble metal such as Au, Pt, Pd, Ir, Rh, or Ru.

19. The MEMS resonator or filter as recited in claim 1, wherein said middle structural layer of said resonating member comprises from a dielectric selected from the group consisting of AlN, $Al_2O_3$, $Si_3N_4$, SiN, $SiO_2$, SiON, TaSiN, SiCH, SiCOH, and any of a variety of piezoelectric materials.

20. The MEMS resonator or filter as recited in claim 1, wherein said first air gap is created by first depositing and then later removing a layer of sacrificial material.

21. The MEMS resonator or filter as recited in claim 1, wherein a first sacrificial material used in the creation of said first air gap is one of a group of carbon-based materials, in any solid form of C, CH, CHO, or CHON.

22. The MEMS resonator or filter as recited in claim 1, wherein a first sacrificial material used in the creation of said first air gap is selected from the group consisting of diamond-like carbon (DLC), Silicon-low K (SiLK©), poly arylene ether, polyimide, and photoresist.

23. The MEMS resonator or filter as recited in claim 1, wherein the said upper membrane is selected from the group consisting of $SiO_2$, SiN, SiON, SiCH, SiCOH, or some combination of these.

24. The MEMS resonator or filter as recited in claim 1, wherein said air gap between said resonating member and said upper membrane is created by depositing and then later removing a layer of sacrificial material.

25. The MEMS resonator or filter as recited in claim 24, wherein said sacrificial material used in the creation of the air gap between said resonating member and said upper membrane is one of a group of carbon-based materials, in any solid form of C, CH, CHO, or CHON.

26. The MEMS resonator or filter as recited in claim 24, wherein said second sacrificial material used in the creation of the air gap between said resonating member and said upper membrane is made from diamond-like carbon (DLC), Silicon-low K (SiLK©), polyimide, or photoresist.

27. The MEMS resonator or filter as recited in claim 21, wherein first sacrificial layer and a second sacrificial layer are the same material.

28. The MEMS resonator or filter as recited in claim 21, wherein said first sacrificial layer and sacrificial layer are different materials.

29. The MEMS resonator or filter as recited in claim 1, wherein small via holes are formed in said upper membrane covering cavity 51 for the purpose of removal of first and second sacrificial layers.

30. The MEMS resonator or filter as recited in claim 1, wherein small via holes in said upper membrane are sealed by the deposition of additional material after removal of first and second sacrificial layers.

31. The MEMS resonator or filter as recited in claim 1, wherein an additional layer of thin film metal is placed over said upper membrane of said evacuated cavity subsequent to removal of a first and second sacrificial layer through via holes and sealing of said via holes.

* * * * *